US011181825B2

(12) United States Patent
Hashimoto et al.

(10) Patent No.: US 11,181,825 B2
(45) Date of Patent: Nov. 23, 2021

(54) EXPOSURE APPARATUS AND METHOD OF MANUFACTURING ARTICLE

(71) Applicant: CANON KABUSHIKI KAISHA, Tokyo (JP)

(72) Inventors: Akihito Hashimoto, Saitama (JP); Akio Akamatsu, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/876,453

(22) Filed: May 18, 2020

(65) Prior Publication Data

US 2020/0371443 A1  Nov. 26, 2020

(30) Foreign Application Priority Data

May 22, 2019  (JP) .............................. JP2019-096252

(51) Int. Cl.
*G03F 7/20* (2006.01)

(52) U.S. Cl.
CPC ...... *G03F 7/70133* (2013.01); *G03F 7/70641* (2013.01)

(58) Field of Classification Search
CPC .................... G03F 7/70133; G03F 7/70641
See application file for complete search history.

(56) References Cited

U.S. PATENT DOCUMENTS

| 5,331,369 A * | 7/1994 | Terasawa | G03F 9/7026 355/125 |
| 6,714,281 B1 * | 3/2004 | Amano | G03F 7/70641 250/548 |
| 2004/0001192 A1 * | 1/2004 | Lyons | G01B 11/00 355/55 |

FOREIGN PATENT DOCUMENTS

JP      H04348019 A    12/1992

* cited by examiner

*Primary Examiner* — Steven Whitesell Gordon
(74) *Attorney, Agent, or Firm* — Rossi, Kimms & McDowell LLP

(57) ABSTRACT

The present invention provides an exposure apparatus that performs an exposure process to transfer a pattern of a mask to a substrate, including a projection optical system configured to project the pattern of the mask onto the substrate, a measurement pattern arranged on an object plane of the projection optical system and including a plurality of pattern elements having different positions in an optical axis direction of the projection optical system, a first detection unit configured to detect light from the measurement pattern via the projection optical system, and a control unit configured to control a relative position between the mask and the substrate in the optical axis direction when the exposure process is performed.

19 Claims, 15 Drawing Sheets

F I G. 6A
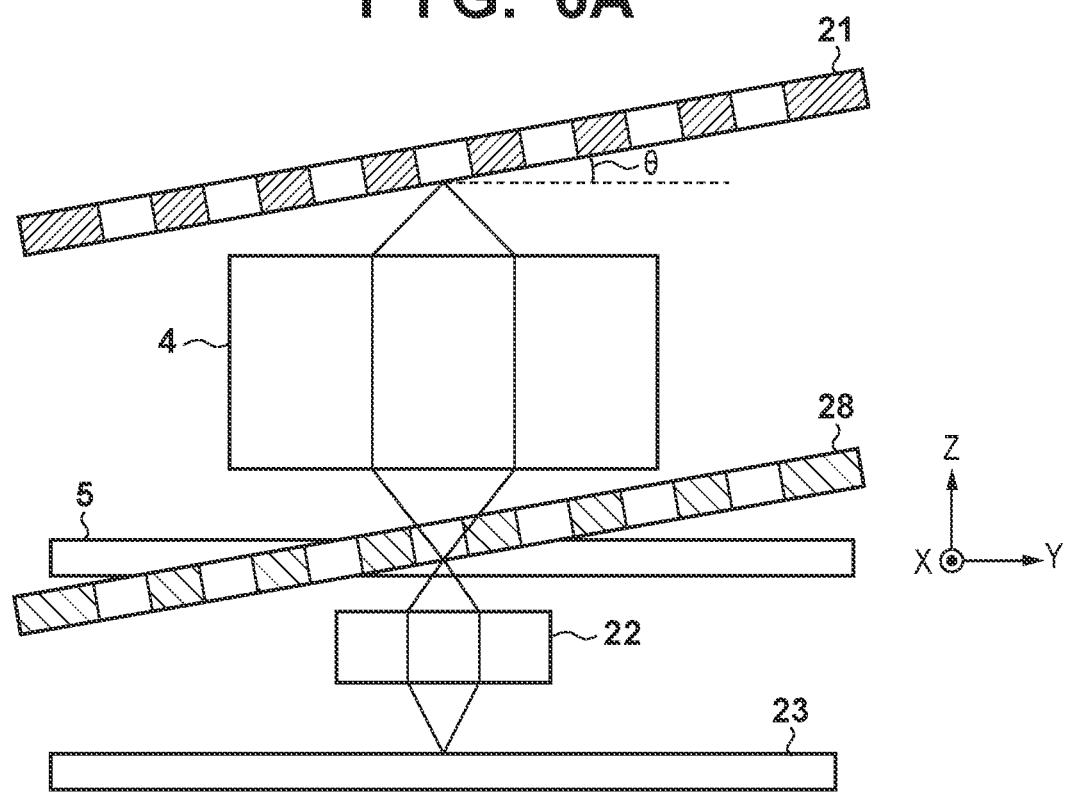
F I G. 6B
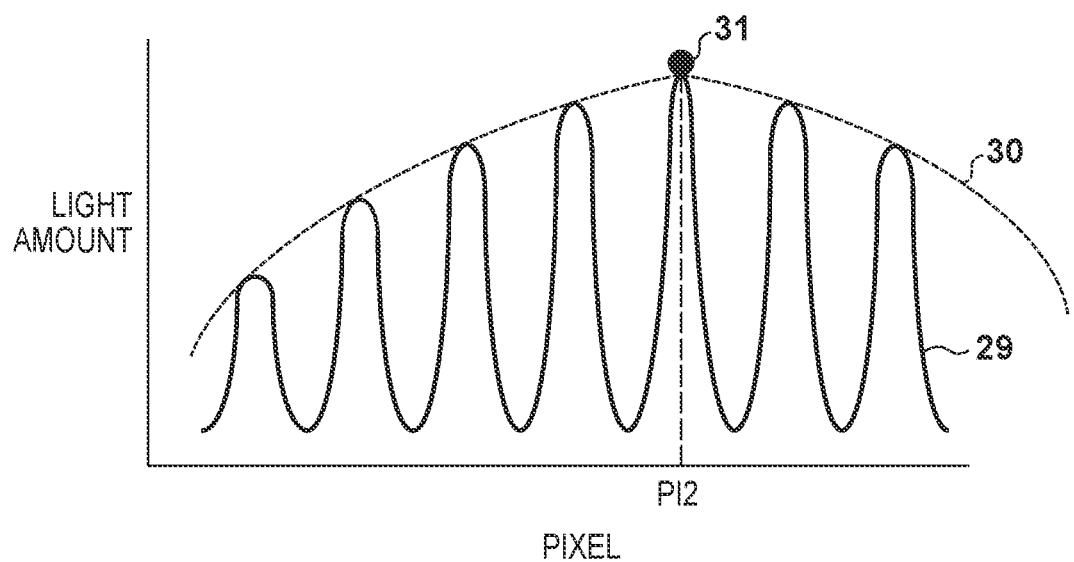

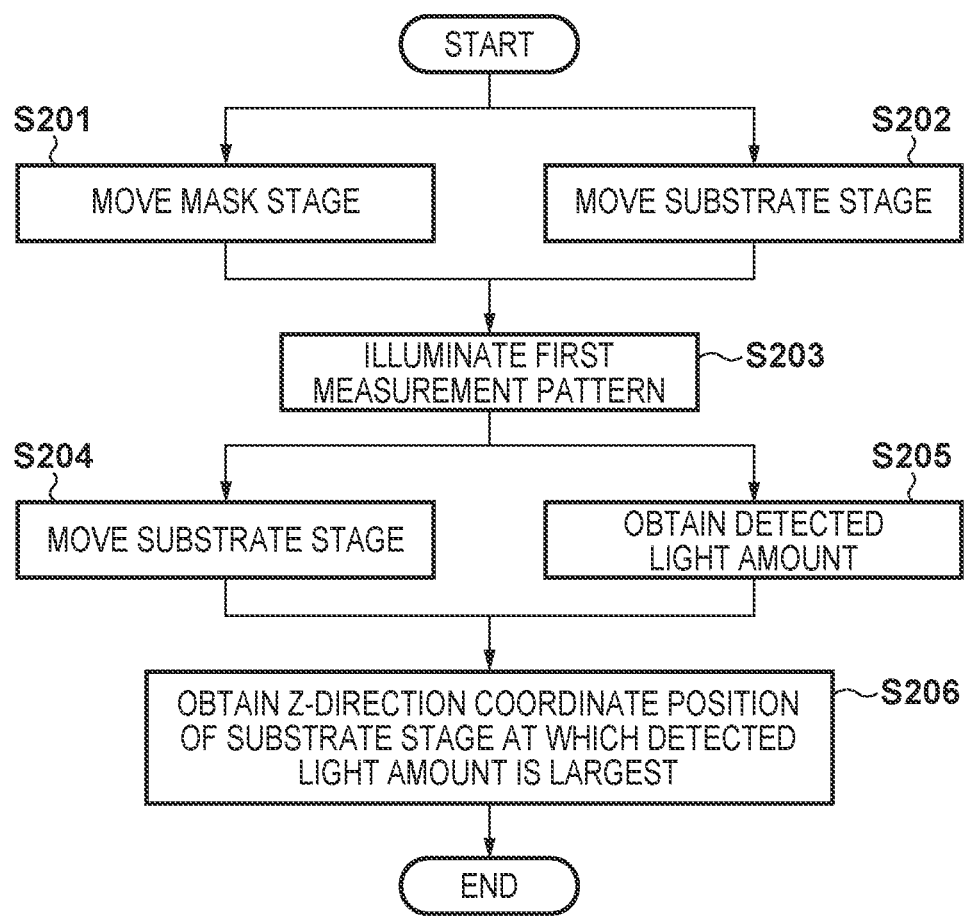

EXPOSURE APPARATUS AND METHOD OF MANUFACTURING ARTICLE

BACKGROUND OF THE INVENTION

Field of the Invention

The present invention relates to an exposure apparatus and a method of manufacturing an article.

Description of the Related Art

When manufacturing a device such as a semiconductor device or a liquid crystal display device by a photolithography process, an exposure apparatus that projects the image of the pattern of a mask onto a substrate and transfers the pattern to the substrate is used. The exposure apparatus is required to perform highly accurate alignment and focus calibration between the mask and the substrate in order to accurately transfer the pattern of the mask to the substrate.

As one of alignment and focus calibration methods, Japanese Patent Laid-Open No. 4-348019 proposes a TTL (Through The Lens) method in which the relative position of a substrate with respect to a mask or the focus position of the pattern of the mask is measured via a projection optical system. In focus calibration, in general, light having passed through a mask-side mark is detected via a projection optical system and a substrate-side mark while moving the substrate-side mark (a stage with the substrate-side mark provided thereon) in the optical axis direction (Z direction) of the projection optical system, and a focus position is obtained from the change of the light amount.

However, in the related art, it is required to move the substrate-side mark (stage) in the Z direction each time focus calibration is performed. Such operation requires time, which causes a decrease in productivity. In addition, since the operation of moving the substrate-side mark in the Z direction and an actual exposure operation cannot be performed in parallel, the focus position (focus state) in the actual exposure operation cannot be obtained. Therefore, even if the focus calibration is performed, the substrate cannot be maintained at an optimum focus position (best focus position) in the actual exposure operation, which can cause a decrease in exposure accuracy.

SUMMARY OF THE INVENTION

The present invention provides an exposure apparatus advantageous in terms of focus calibration.

According to one aspect of the present invention, there is provided an exposure apparatus that performs an exposure process to transfer a pattern of a mask to a substrate, including a projection optical system configured to project the pattern of the mask onto the substrate, a measurement pattern arranged on an object plane of the projection optical system and including a plurality of pattern elements having different positions in an optical axis direction of the projection optical system, a first detection unit configured to detect light from the measurement pattern via the projection optical system, and a control unit configured to control a relative position between the mask and the substrate in the optical axis direction when the exposure process is performed, wherein the control unit controls the relative position based on a first light amount distribution, which represents a light amount of light having passed through each of the plurality of pattern elements, obtained from a detection result of the first detection unit at a first timing and a second light amount distribution, which represents a light amount of light having passed through each of the plurality of pattern elements, obtained from a detection result of the first detection unit at a second timing after the first timing.

Further features of the present invention will become apparent from the following description of exemplary embodiments with reference to the attached drawings.

BRIEF DESCRIPTION OF THE DRAWINGS

FIGS. 6A and 6B are views for explaining the change amount measurement processing for obtaining the focus change amount.

FIG. 19 is a flowchart illustrating the details of focus measurement processing.

DESCRIPTION OF THE EMBODIMENTS

Figure 1A:
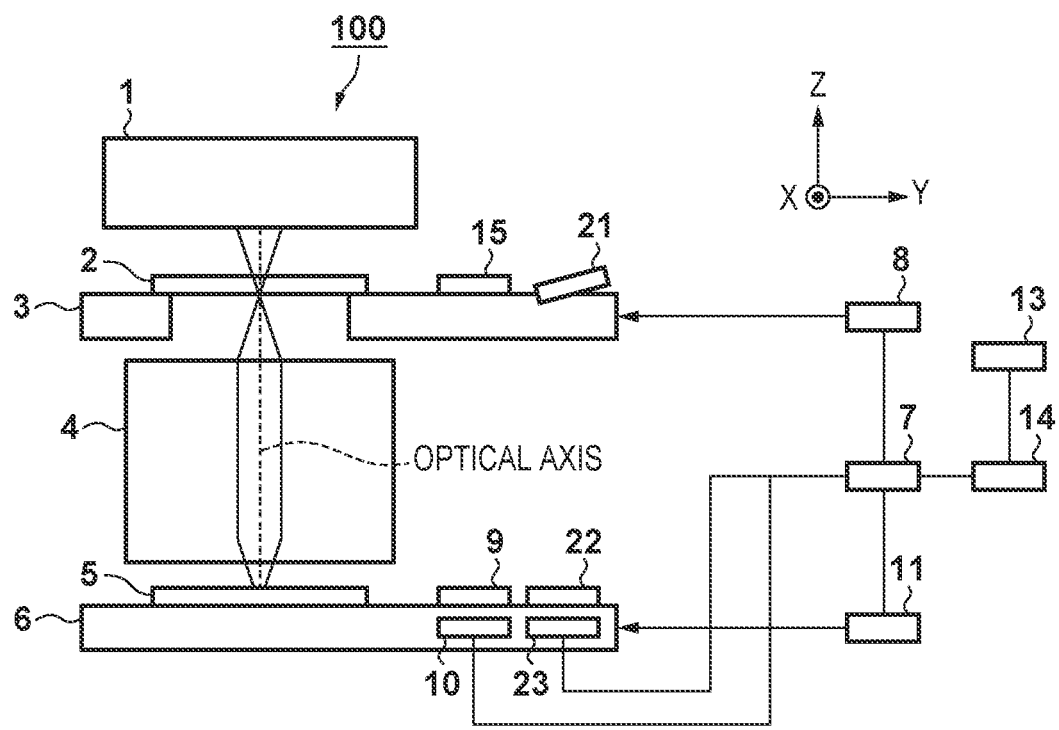
FIGS. 1A and 1B are schematic views showing the arrangement of an exposure apparatus as one aspect of the present invention.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

Figure 15:
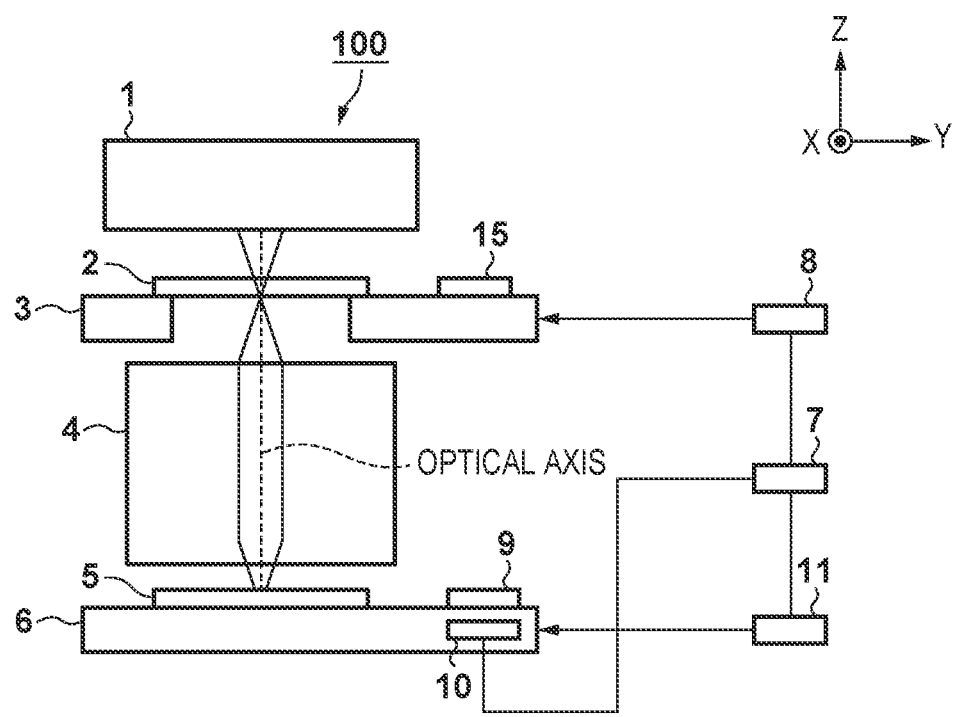
FIG. 15 is a schematic view showing the arrangement of an exposure apparatus according to a related art.

First, with reference to FIGS. 15 to 19, focus calibration using a TTL method according to a related art will be described. FIG. 15 is a schematic view showing the arrangement of an exposure apparatus according to the related art. Here, the XYZ coordinate system is defined such that the horizontal plane is the X-Y plane and the vertical direction is the Z-axis direction.

With reference to FIG. 15, light (exposure light) from an illumination optical system 1 passes through a mask 2 held by a mask stage 3 and reaches, via a projection optical system 4, a substrate 5 held by a substrate stage 6. The mask 2 (pattern plane thereof) and the substrate 5 are set in a conjugate positional relationship by the projection optical system 4. Accordingly, the pattern (actual device pattern) of the mask 2 is projected onto the substrate via the projection optical system 4 and transferred to the substrate 5.

Figure 16:
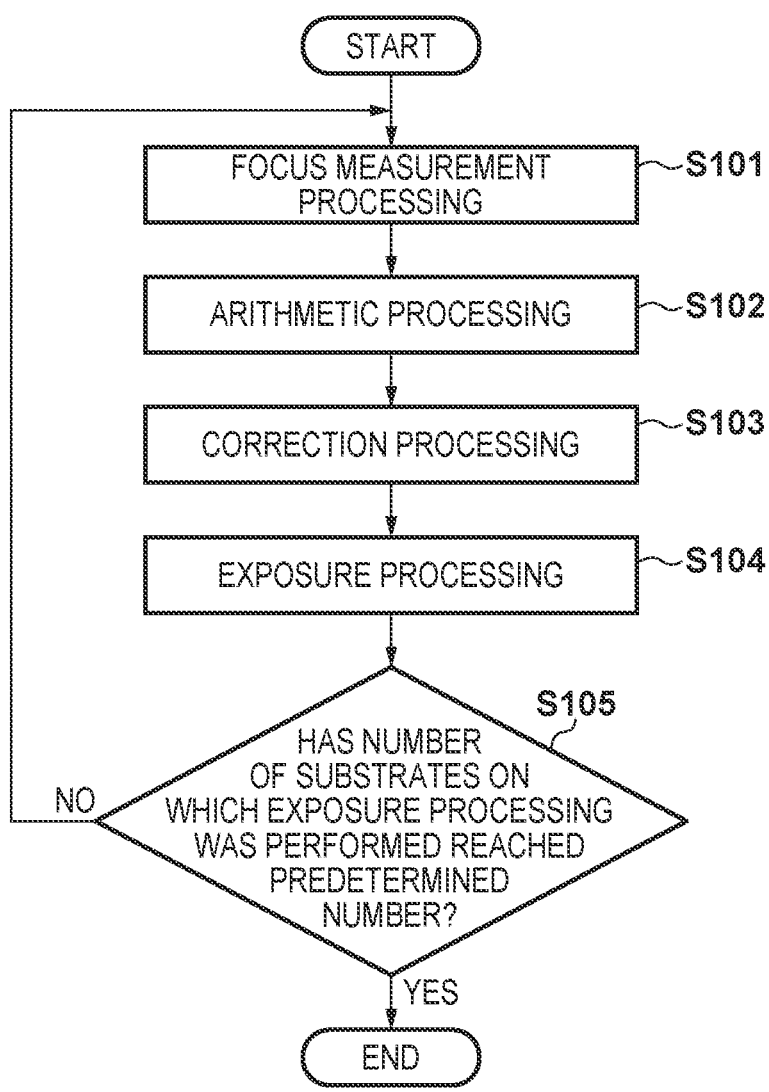
FIG. 16 is a flowchart for explaining an operation of the exposure apparatus shown in FIG. 15.

FIG. 16 is a flowchart for explaining an operation of the exposure apparatus shown in FIG. 15. In step S101, focus measurement processing for obtaining an imaging position (best focus position) of the pattern of the mask 2 is performed. In step S102, arithmetic processing is performed to obtain, from the result of the focus measurement processing in step S101, an optimum position of the substrate 5 suitable for exposure (the movement amount of the substrate stage 6 required to position the substrate 5 at the best focus position) and a driving amount of the correction member of the projection optical system 4. In step 5103, correction processing is performed to drive the substrate stage 6 and the correction member based on the optimum position of the substrate 5 and the driving amount of the correction member obtained in the arithmetic processing in step S102. In step S104, exposure processing is performed to transfer the pattern of the mask 2 to the substrate 5. In step S105, it is determined whether the number of the substrates 5 having undergone the exposure processing has reached a predetermined number. If the number of the substrates 5 having undergone the exposure processing has not reached to the predetermined number, the process returns to step S101. On the other hand, if the number of the substrates 5 having undergone the exposure processing has reached the predetermined number, the operation is terminated.

Figure 17:
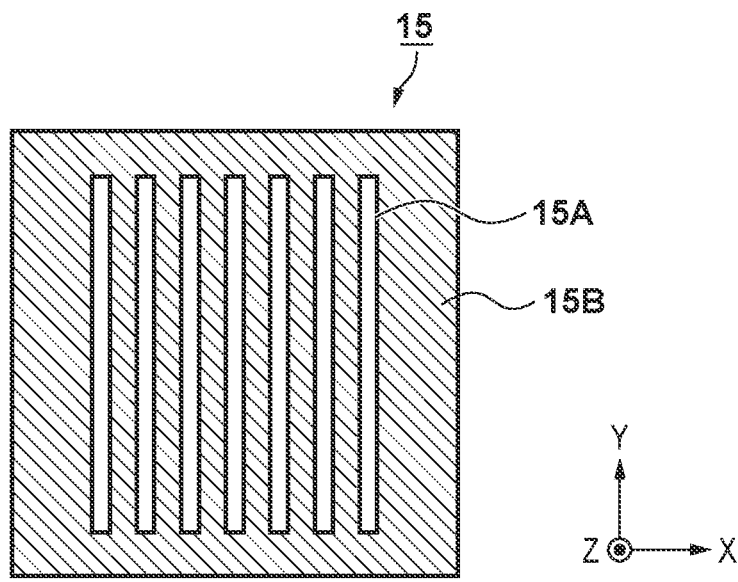
FIG. 17 is a view showing an example of the arrangement of a first measurement pattern.

Here, the focus measurement processing (step S101) and the correction processing (S103) will be specifically described. In the focus measurement processing, first, the mask stage 3 is moved using an interferometer (not shown) under the control of a mask stage control unit 8 such that a first measurement pattern 15 provided on the mask 2 or the mask stage 3 is located below the illumination optical system 1. FIG. 17 is a view showing an example of the arrangement of the first measurement pattern 15. The first measurement pattern 15 includes a plurality of pattern elements 15A having a predetermined line width and pitch for allowing light from the illumination optical system 1 to pass (be transmitted) therethrough and a light shielding portion 15B that shields light from the illumination optical system 1, and is formed by a flat plate with the plurality of pattern elements 15A formed therein.

Next, the substrate stage 6 is moved using an interferometer (not shown) under the control of a substrate stage control unit 11 such that a second measurement pattern 9 provided on the substrate stage 6 is arranged at a position corresponding to the first measurement pattern 15. The second measurement pattern 9 includes a plurality of pattern elements and a light shield portion corresponding to the first measurement pattern 15. A detector 10 that detects light (light amount thereof) having passed through the second measurement pattern 9 is provided below the second measurement pattern 9.

Figure 18:
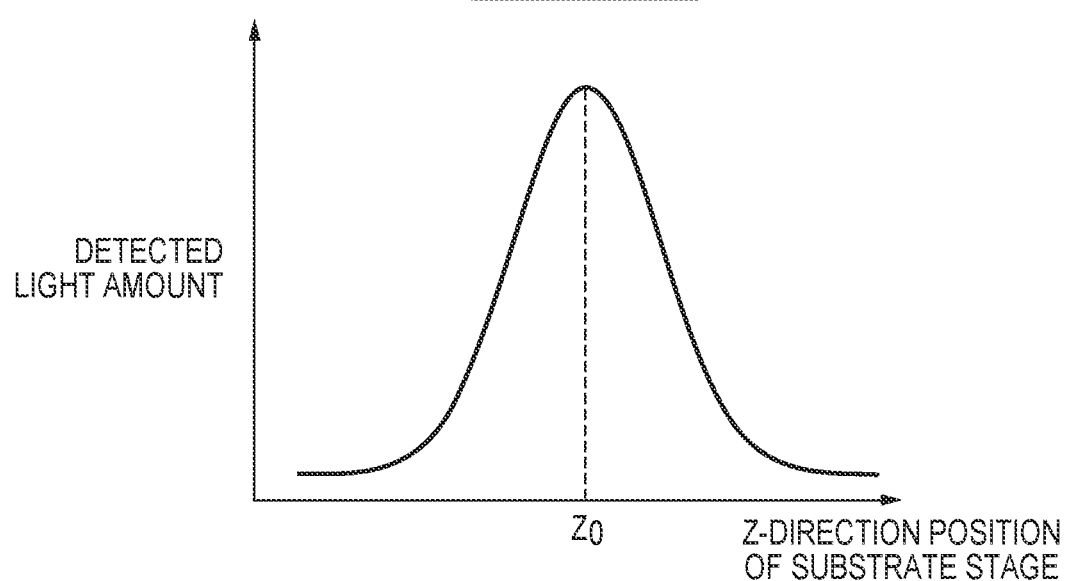
FIG. 18 is a view showing an example of the relationship between a light amount of light detected by a detector and the Z-direction coordinate position of a substrate stage.

In the state described above, a coordinate position $Z_0$ o at which the light amount of the light detected by the detector 10 is largest is obtained by a main control unit 7 while slightly moving the substrate stage 6 in the optical axis direction (Z direction) of the projection optical system 4. FIG. 18 is a graph showing an example of the relationship between the light amount (detected light amount) of the light detected by the detector 10 and the Z-direction coordinate position of the substrate stage 6, in which the ordinate represents the detected light amount and the abscissa represents the Z-direction coordinate position of the substrate stage 6. The Z-direction coordinate position of the substrate stage 6 at which the detected light amount is largest is a coordinate position at which the first measurement pattern 15 and the second measurement pattern 9 are in a conjugate positional relationship. Accordingly, by searching for the Z-direction coordinate position of the substrate stage 6 at which the detected light amount is largest, the imaging position of light from the first measurement pattern 15, that is, the focus position (best focus position) of the pattern of the mask 2 can be obtained. Then, the main control unit 7 moves, based on the obtained focus position, the substrate stage 6 in the Z direction by a shift of the focus position, so that the focus position of the pattern of the mask 2 can be adjusted to the substrate 5.

FIG. 19 is a flowchart illustrating the details of the focus measurement processing in step S101. In step S201, the mask stage 3 is moved to a focus measurement position such that the first measurement pattern 15 is located below the illumination optical system 1. In step S202, the substrate stage 6 is moved to a focus measurement position such that the second measurement pattern 9 is arranged at a position corresponding to the first measurement pattern 15. Either of steps S201 and S202 may be performed first, or they may be performed in parallel. In step S203, the first measurement pattern 15 is illuminated with light from the illumination optical system 1. In step S204, the substrate stage 6 is moved in the Z direction. In step S205, the detector 10 detects the light having passed through the second measurement pattern 9 to obtain the detected light amount. Note that steps S204 and S205 are performed in parallel (simultaneously). In step S206, based on the Z-direction position of the substrate stage 6 in step S204 and the detected light amount obtained in step S205, the Z-direction position of the substrate stage 6 at which the detected light amount is largest is obtained.

As has been described above, in the related art, it is required to move the substrate stage 6 with the second measurement mark 9 provided thereon in the Z direction each time focus calibration is performed. This causes a decrease in productivity of the exposure apparatus. In addition, in the related art, the focus position in the actual exposure processing is not obtained. Therefore, the substrate 5 cannot be maintained at the optimum focus position (best focus position) in the actual exposure processing, which causes a decrease in exposure accuracy.

Therefore, in this embodiment, there is provided an exposure apparatus advantageous in terms of focus calibration, that is, a technique that suppresses a decrease in productivity and a decrease in exposure accuracy of the exposure apparatus caused by focus calibration.

Figure 1B:
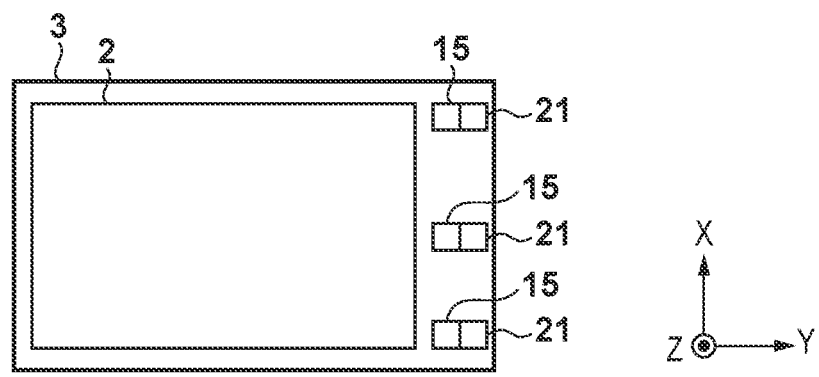

FIGS. 1A and 1B are schematic views showing the arrangement of an exposure apparatus 100 as one aspect of the present invention. FIG. 1A is a front view of the entire exposure apparatus 100, and FIG. 1B is a plan view showing the arrangement around a mask stage 3. In this embodiment, the XYZ coordinate system is defined such that the horizontal plane is the X-Y plane and the vertical direction is the Z-axis direction.

The exposure apparatus 100 is a lithography apparatus used in a photolithography process which is a process for manufacturing a device such as a semiconductor device or a liquid crystal display device. In this embodiment, the exposure apparatus 100 employs a step-and-scan method, and performs an exposure process of exposing a substrate via a mask to transfer the pattern of the mask to the substrate. Note that the exposure apparatus 100 may employ a step-and-repeat method or another exposure method.

The exposure apparatus 100 includes an illumination optical system 1 that illuminates a mask 2, the mask stage 3 that holds and moves the mask 2, a projection optical system 4 that projects the pattern of the mask 2 onto a substrate 5, and a substrate stage 6 that holds and moves the substrate 5. The exposure apparatus 100 further includes a main control unit 7, a mask stage control unit 8, a substrate stage control unit 11, an input unit 13, and a determination unit 14. Furthermore, the exposure apparatus 100 includes a first measurement pattern 15 (object plane-side pattern), a second measurement pattern 9 (image plane-side pattern), a detector 10 (second detection unit), a third measurement pattern 21 (measurement pattern), an imaging system 22, and an image sensor 23 (first detection unit). The main control unit 7 is formed by a computer including a CPU, a memory, and the like, and comprehensively controls the respective units of the exposure apparatus 100 in accordance with programs stored in a storage unit to operate the exposure apparatus 100. For example, the main control unit 7 controls the relative position between the mask 2 and the substrate 5 in the optical axis direction of the projection optical system 4 when an exposure process is performed.

Light (exposure light) from the illumination optical system 1 passes through the mask 2 held by the mask stage 3 and reaches, via the projection optical system 4, the substrate 5 held by the substrate stage 6. The mask 2 (pattern plane thereof) and the substrate 5 are set in a conjugate positional relationship by the projection optical system 4. Accordingly, the pattern (actual device pattern) of the mask 2 is projected onto the substrate via the projection optical system 4 and transferred to the substrate 5. In this embodiment, a step-and-scan method is employed. Therefore, the pattern of the mask 2 is transferred to the substrate 5 by synchronously scanning the mask stage 3 and the substrate stage 6 in the Y direction.

The arrangement related to focus calibration in the exposure apparatus 100 will be described. Exposure conditions (an exposure region, an illumination mode, the pattern of the mask 2, and the like) upon performing an exposure process, that is, transferring the pattern of the mask 2 to the substrate 5 are input to the input unit 13 by user operations. The determination unit 14 determines, based on the exposure conditions input to the input unit 13, measurement conditions (a measurement position (image height position), a measurement pattern, and the like) required for focus calibration.

As shown in FIG. 17, the first measurement pattern 15 includes a plurality of pattern elements 15A having a predetermined line width and pitch. In this embodiment, the plurality of pattern elements 15A are arranged along the X direction to form a line and space pattern. The first measurement pattern 15 is provided on the mask stage 3 (the object plane of the projection optical system 4), and positioned at a target measurement position by the mask stage 3. Note that the first measurement pattern 15 may include various types of pattern elements having different line widths, pitches, or directions and forming a line and space pattern. In other words, the number, types, and directions of the plurality of pattern elements forming the first measurement pattern 15 are not limited to specific ones.

As shown in FIG. 1B, the plurality of the first measurement patterns 15 are provided on the mask stage 3 so as to be spaced apart in the X direction. One first measurement pattern 15 may be provided on the mask stage 3, but in order to measure the characteristics of the projection optical system 4, it is preferable to provide the plurality of the first measurement patterns 15. The characteristics of the projection optical system 4 include, for example, the focus position, distortion, and the like.

When performing focus measurement processing, the main control unit 7 moves the mask stage 3 via the mask stage control unit 8 so as to position the first measurement pattern 15 at a measurement position determined by the determination unit 14. Similarly, when performing focus measurement processing, the main control unit 7 moves the substrate stage 6 via the substrate stage control unit 11 so as to position the second measurement pattern 9 at a measurement position determined by the determination unit 14.

The detector 10 is provided in the substrate stage 6 so as to locate below the second measurement pattern 9, and detects light having passed (transmitted) through the second measurement pattern 9, that is, light from the first measurement pattern 15 via the projection optical system 4 and the second measurement pattern 9. Note that the detector 10 may detect not light transmitted through the first measurement pattern 15 and the second measurement pattern 9, but light reflected by the first measurement pattern 15 and the second measurement pattern 9.

Figure 2:
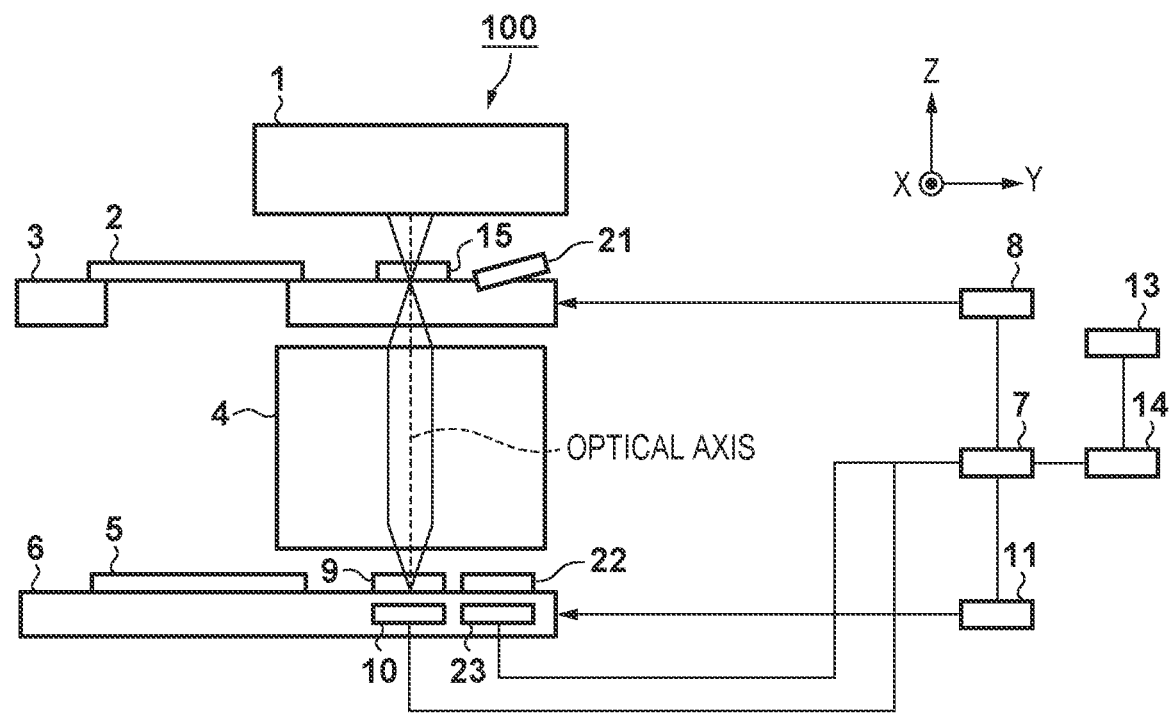
FIG. 2 is a schematic view showing the exposure apparatus at the time of focus measurement processing.

FIG. 2 is a schematic view showing a state in which each of the first measurement pattern 15 and the second measurement pattern 9 is positioned at its measurement position, that is, the exposure apparatus 100 at the time of focus measurement processing. In focus measurement processing, the first measurement pattern 15 is illuminated with light from the illumination optical system 1, and the light having passed through the first measurement pattern 15 is detected by the detector 10 via the projection optical system 4 and the second measurement pattern 9. At this time, a position $Z_0$ at which the light amount (detected light amount) of the light detected by the detector 10 is largest is obtained by the main control unit 7 while slightly moving the substrate stage 6 in the optical axis direction (Z direction) of the projection optical system 4. Since the Z-direction coordinate position of the substrate stage 6 at which the detected light amount is largest is a coordinate position at which the first measurement pattern 15 and the second measurement pattern 9 are in a conjugate positional relationship, such a coordinate position is an optimum focus position (best focus position). Note that the relationship between the detected light amount and the Z-direction coordinate position of the substrate stage 6 is as shown in FIG. 18.

In this embodiment, in focus calibration, change amount measurement processing is performed in which a focus change amount (a change amount of the best focus position) after focus measurement processing is obtained without moving the substrate stage 6 in the Z direction. Therefore, the mask stage 3 (the object plane of the projection optical system 4) is provided with the third measurement pattern 21 (measurement pattern), and the substrate stage 6 (the image plane of the projection optical system 4) is provided with the imaging system 22 and the image sensor 23 (first detection unit).

As will be described later, the third measurement pattern 21 is arranged obliquely with respect to the optical axis of the projection optical system 4. The imaging system 22 is an optical system that is provided between the projection optical system 4 and the image sensor 23 and forms an image of the third measurement pattern 21 on the image sensor. In this embodiment, the imaging system 22 is an optical system that applies a magnification to an image of the third measurement pattern 21 and guides the light onto the image sensor. The magnification can be set in accordance with the resolution of the image sensor 23. The image sensor 23 includes a plurality of pixels, and detects (captures) the image of the third measurement pattern 21 formed by the imaging system 22.

When performing change amount measurement processing, the main control unit 7 moves the mask stage 3 via the mask stage control unit 8 so as to position the third measurement pattern 21 at a measurement position determined by the determination unit 14. Similarly, when performing change amount measurement processing, the main control unit 7 moves the substrate stage 6 via the substrate stage control unit 11 so as to position each of the imaging system 22 and the image sensor 23 at its measurement position determined by the determination unit 14.

Figure 3:
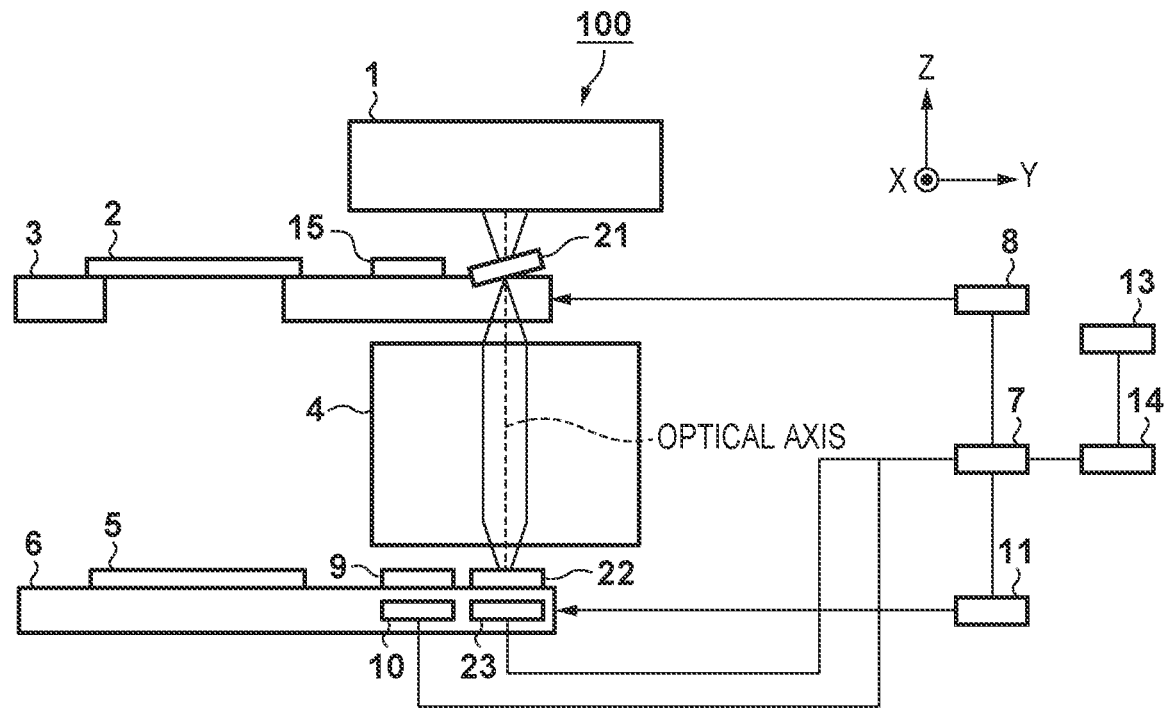
FIG. 3 is a schematic view showing the exposure apparatus at the time of change amount measurement processing.

FIG. 3 is a schematic view showing a state in which each of the third measurement pattern 21, the imaging system 22, and the image sensor 23 is positioned at its measurement position, that is, the exposure apparatus 100 at the time of change amount measurement processing. As shown in FIG. 3, the third measurement pattern 21 is positioned below the illumination optical system 1 and illuminated with light from the illumination optical system 1. The light from the third measurement pattern 21 is detected as the image of the third measurement pattern 21 by the image sensor 23 via the projection optical system 4 and the imaging system 22. The main control unit 7 determines, based on the image of the measurement pattern 21 detected by the image sensor 23, the current focus position (best focus position) in the image sensor 23.

Figure 4A:
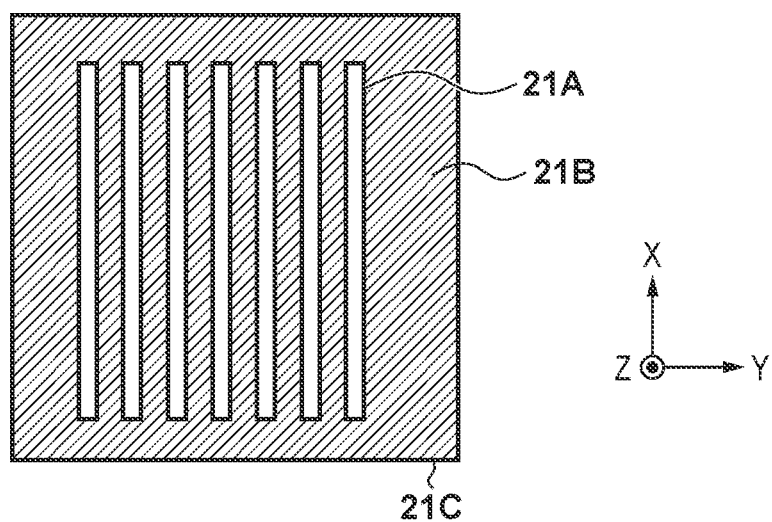
FIGS. 4A and 4B are views showing an example of the arrangement of a third measurement pattern.
Figure 4B:
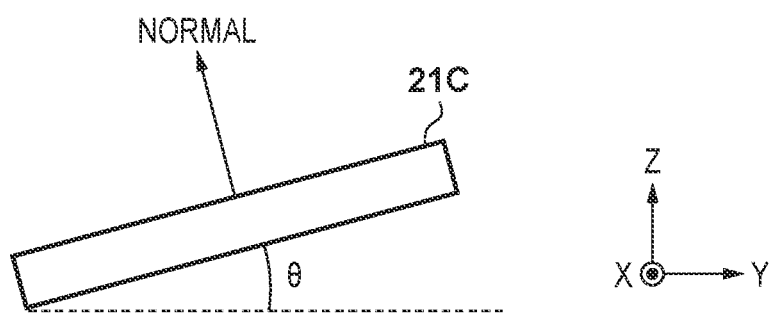

FIGS. 4A and 4B are views showing an example of the arrangement of the third measurement pattern 21. FIG. 4A is a plan view of the third measurement pattern 21, and FIG. 4B is a side view of the third measurement pattern 21. As shown in FIG. 4A, the third measurement pattern 21 includes a plurality of pattern elements 21A having a predetermined line width and pitch for allowing light from the illumination optical system 1 to pass (be transmitted) therethrough, and a light shielding portion 21B that shields light from the illumination optical system 1. The third measurement pattern 21 is formed by a flat plate 21C with the plurality of pattern elements 21A formed therein. In this embodiment, the plurality of pattern elements 21A are arrayed along the Y direction to form a line and space pattern. In addition, as shown in FIG. 4B, the third measurement pattern 21 is arranged to be inclined by a predetermined angle θ about an axis in the X direction. More specifically, the normal of the flat plate 21C is arranged to be inclined with respect to the optical axis of the projection optical system 4 so that the plurality of pattern elements 21A have different positions in the optical axis direction (Z direction). The direction in which the third measurement pattern 21 is inclined is same as the direction in which the plurality of pattern elements 21A (lines and spaces) are continuous.

Note that in this embodiment, the plurality of pattern elements 21A are arranged to have different positions in the optical axis direction by inclining the third measurement pattern 21, but the present invention is not limited to this. The third measurement pattern 21 is only required to include the plurality of pattern elements 21A having different positions in the optical axis direction of the projection optical system 4. Therefore, for example, the third measurement pattern 21 may be formed by a stepwise member, and the pattern element 21A may be formed on each step of the member.

As shown in FIG. 1B, the plurality of the third measurement patterns 21 are provided on the mask stage 3 so as to be spaced apart in the X direction. One third measurement pattern 21 may be provided on the mask stage 3, but in order to measure the characteristics of the projection optical system 4, it is preferable to provide the plurality of the third measurement patterns 21. In addition, the third measurement pattern 21 is arranged in the +Y direction with respect to the first measurement pattern 15, but it may be arranged in the −Y direction with respect to the first measurement pattern 15, or may be shifted in the ±X directions with respect the first measurement pattern 15. However, in order to decrease the influence of the projection optical system 4 in focus measurement processing, it is preferable that the first measurement pattern 15 and the third measurement pattern 21 are arranged close to each other. This is because the focus position (best focus position) changes in accordance with the image height of the projection optical system 4.

Figure 5A:
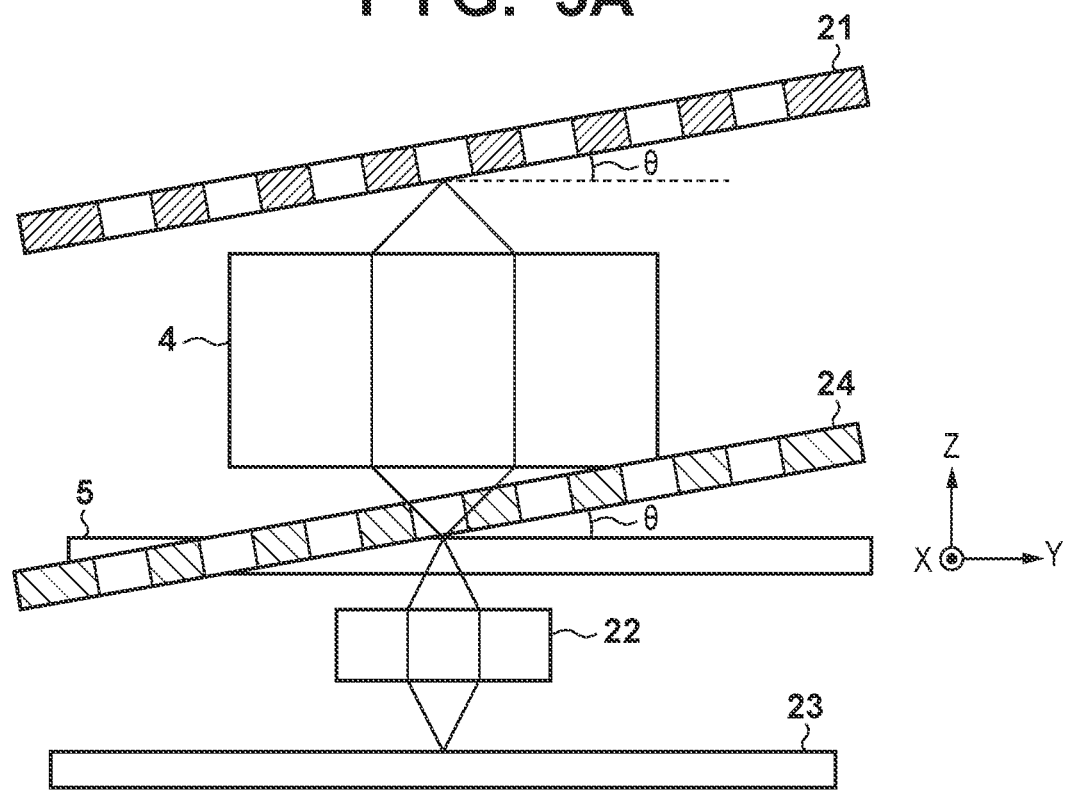
FIGS. 5A and 5B are views for explaining the change amount measurement processing for obtaining a focus change amount.

With reference to FIGS. 5A to 6B, change amount measurement processing for obtaining a focus change amount will be described. Each of FIGS. 5A and 6A shows the third measurement pattern 21, the projection optical system 4, the substrate 5, the imaging system 22, and the image sensor 23 in change amount measurement processing. Further, the image of the third measurement pattern 21 formed on the substrate by the projection optical system 4 is shown as an image 24 in FIG. 5A. The image 24 is detected by the image sensor 23 via the imaging system 22. FIG. 5B is a graph showing an example of the detection result of the image sensor 23. When the pixel of the image sensor 23 is represented by the abscissa and the light amount obtained at each pixel is represented by the ordinate, a light amount distribution 25 (first light amount distribution) is obtained.

Figure 5B:
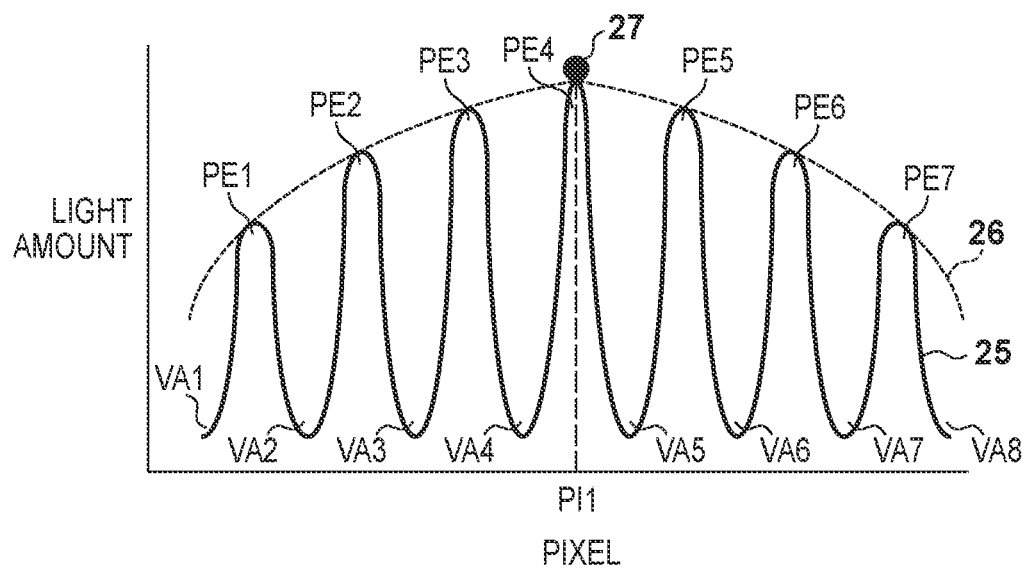

Referring to FIG. 5B, in the light amount distribution 25, portions corresponding to the respective pattern elements 21A of the third measurement pattern 21 appear as portions PE1 to PE7 each having a large light amount, and portions corresponding to the light shielding portion 21B appear as portions VA1 to VA8 each having a small light amount. Since the image 24 is inclined with respect to the image sensor 23, if the best focus position exists within the height of the inclination, the light amount is largest in the portion corresponding to the pattern element 21A near the best focus position. In addition, the light amount is small in the portion corresponding to the pattern element 21A away from the best focus position. FIG. 5B shows a case in which the best focus position exists in the portion PE4. Each of the portions PE3, PE2 and PE1 indicates that the image plane is shifted from the best focus position in the −Z direction, and each of the portions PE5, PE6, and PE7 indicates that the image plane is shifted from the best focus position in the +Z direction. Therefore, if the pixel (position) of the image sensor 23 corresponding to the portion PE4 can be obtained, a best focus position BF can be obtained from following equation (1).

$$BF = P \times \text{Pixel Size} \times \frac{\tan\theta}{\text{Mag}} \quad (1)$$

Here, P indicates the pixel position of the image sensor 23 corresponding to the portion in which the light amount is largest, and Pixel Size indicates the size of pixel of the image sensor 23. In addition, θ indicates an angle formed by the third measurement pattern 21 and a plane (X-Y plane) orthogonal to the optical axis of the projection optical system 4, and Mag indicates the magnification of the imaging system 22.

As has been described above, a position $Z_1$ in the Z direction at which the best focus position is obtained can be obtained from the portion PE4 in which the light amount is largest. However, it is also possible to obtain an envelope 26 using the portion PE4 in which the light amount is largest and the portions (peaks) PE1, PE2, PE3, PE5, PE6, and PE7 away from the best focus position, and approximately obtain the best focus position from the envelope 26. In FIG. 5B, the pixel position of the image sensor 23 corresponding to a local maximum value 27 of the envelope 26 obtained from the portions PE1 to PE7 is indicated as PI1.

FIG. 6A shows a state in which the best focus position has been shifted from that in the state shown in FIG. 5A. As shown in FIG. 6B, the image 24 may be shifted to an image 28 due to air fluctuations inside the projection optical system 4, misalignment of members forming the projection optical system 4, or the like. In such a case, as shown in FIG. 6B, the light amount distribution obtained from the detection result of the image sensor 23 changes from the light amount distribution 25 to a light amount distribution 29 (second light amount distribution). Accordingly, the pixel position of the image sensor 23 corresponding to a local maximum value 31 of an envelope 30 obtained from the light amount distribution 29 is changed to a pixel position PI2, so that the best focus position changes.

Figure 7:
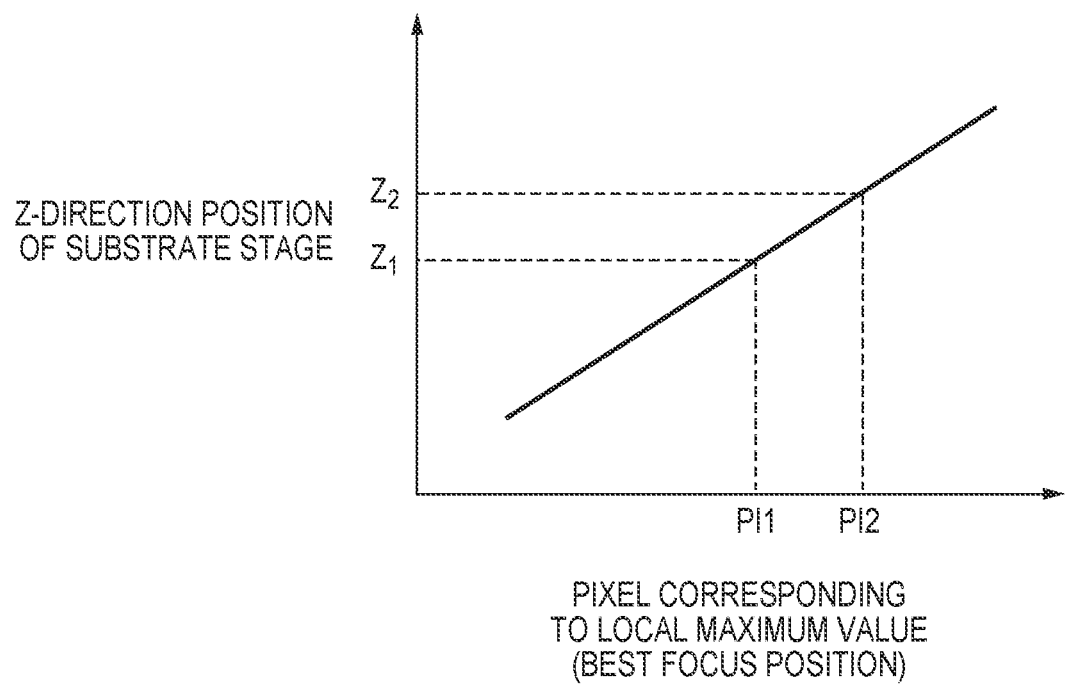
FIG. 7 is a graph showing the relationship between a best focus position and the Z-direction position of a substrate stage.

By obtaining the best focus position using each of the pixel positions P11 and P12, it is possible to obtain the difference between the best focus position at a given timing and the best focus position at a next timing, that is, the change amount of the best focus position. FIG. 7 is a graph showing the relationship between the best focus position and the Z-direction position of the substrate stage 6. Referring to FIG. 7, when the pixel position corresponding to the local maximum value of the envelope changes from P11 to P12, the Z-direction position of the substrate stage 6 can be derived from a linear relationship as also obvious from equation (1), and changes from $Z_1$ to $Z_2$.

A reference focus position serving as the first reference may use the Z-direction position of the substrate stage 6 obtained using the first measurement pattern 15, the second measurement pattern 9, and the detector 10. This is because this position indicates the imaging position (best focus position) of the projection optical system 4.

As has been described above, in change amount measurement processing in this embodiment, when the focus change amount (best focus position) is obtained, an operation of moving the substrate stage 6 (second measurement pattern 9) in the Z direction is unnecessary. Therefore, in this embodiment, a time required for the operation of moving the substrate stage 6 in the Z direction is omitted, so that the productivity (throughput) of the exposure apparatus 100 can be improved.

Figure 8A:
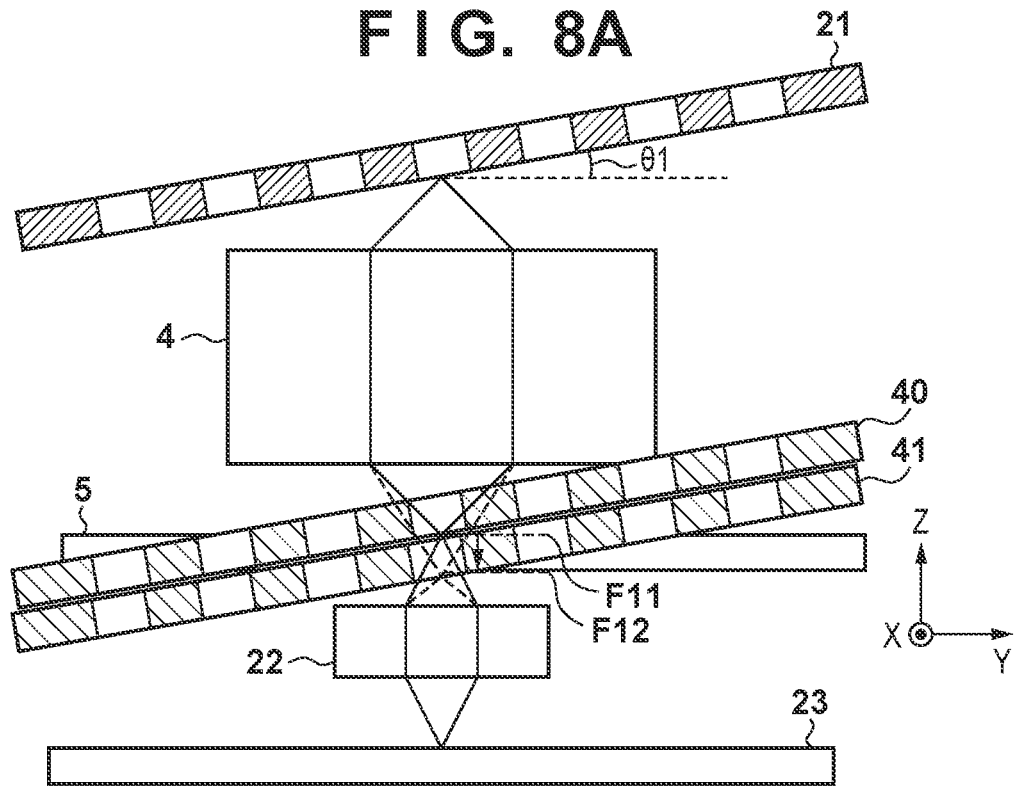
FIGS. 8A and 8B are views for explaining setting of an angle at which the third measurement pattern is inclined with respect to an X-Y plane.

Note that as has been described above, in this embodiment, the third measurement pattern 21 is arranged to be inclined by the angle θ with respect to the X-Y plane, but the angle θ should be set while considering the sensitivity to the focus position and the focus position measurement accuracy (determination accuracy). With reference to FIGS. 8A to 9B, setting of the angle θ by which the third measurement pattern 21 is inclined with respect to the X-Y plane will be descried. Each of FIGS. 8A and 9A shows the third measurement pattern 21, the projection optical system 4, the substrate 5, the imaging system 22, and the image sensor 23 in change amount measurement processing.

Referring to FIG. 8A, the third measurement pattern 21 is arranged to be inclined by an angle θ1 with respect to the X-Y plane. Further, a position F11 indicates the best focus position at a given timing, and the image of the third measurement pattern 21 formed on the substrate by the projection optical system 4 in this state is shown as an image 40. When the best focus position changes from the position F11 to a position F12 due to various kinds of factors, the image of the third measurement pattern 21 changes from the image 40 to an image 41.

Figure 8B:
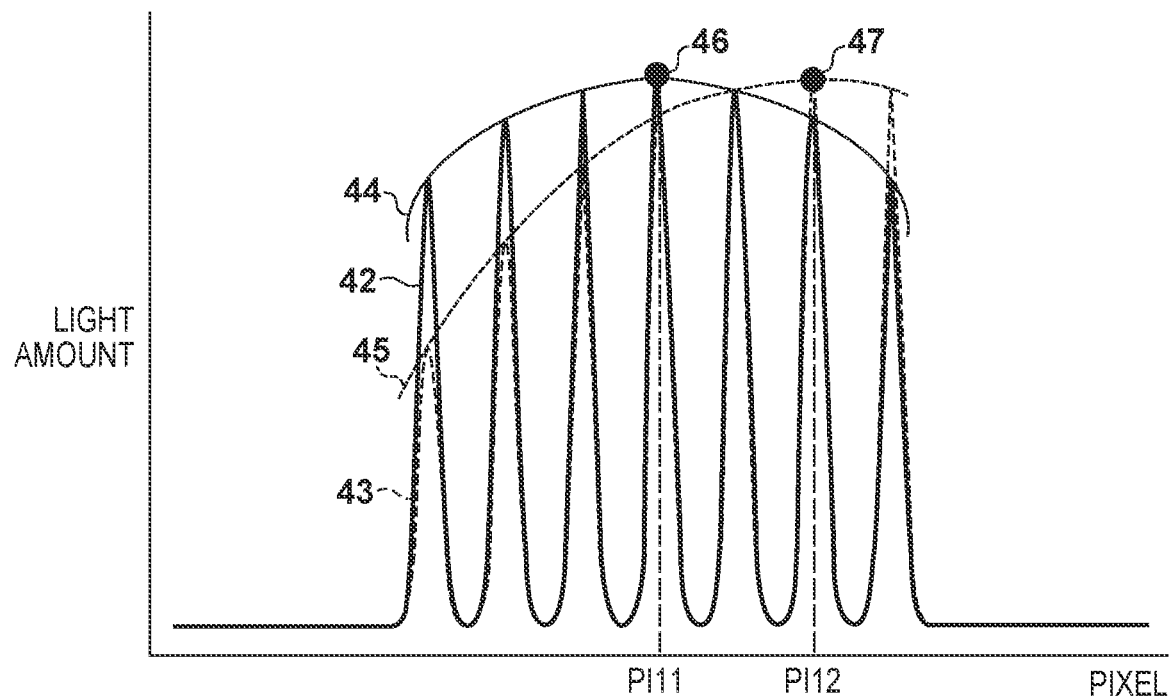
Figure 9A:
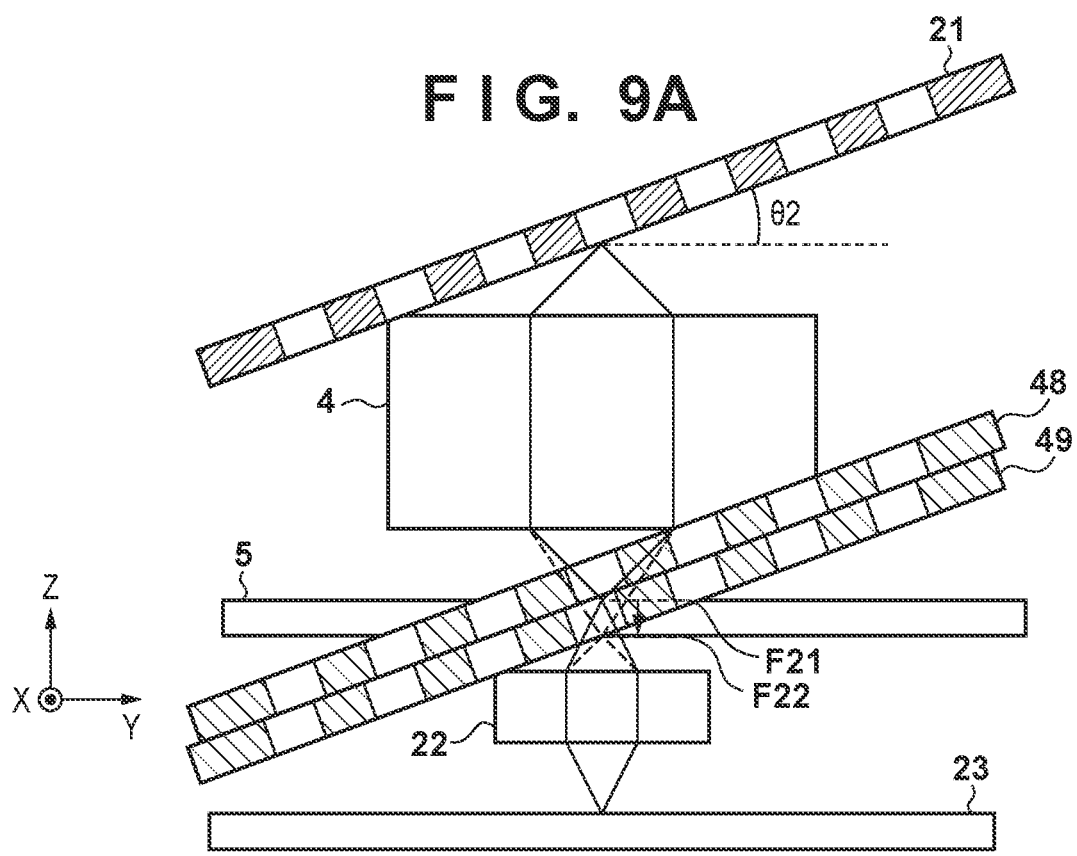
FIGS. 9A and 9B are views for explaining setting of the angle at which the third measurement pattern is inclined with respect to the X-Y plane.

FIG. 8B is a graph showing the image (light amount distribution) detected by the image sensor 23 via the imaging system 22 in the state shown in FIG. 8A, in which the abscissa represents the pixel of the image sensor 23 and the ordinate represents the light amount obtained at each pixel. Referring to FIG. 8B, the image 40 corresponds to a light amount distribution 42, and an envelope 44 is obtained from the light amount distribution 42. Further, a local maximum value 46 and a pixel position PI11 of the image sensor 23 corresponding to the local maximum value 46 are obtained from the envelope 44. In this manner, when the best focus position is the position F11, the pixel position PI11 of the image sensor 23 corresponds to the position F11.

Similarly, the image 41 corresponds to a light amount distribution 43, and an envelope 45 is obtained from the light amount distribution 43. Further, a local maximum value 47 and a pixel position PI12 of the image sensor 23 corresponding to the local maximum value 47 are obtained from the envelope 45. In this manner, when the best focus position is the position F12, the pixel position PI12 of the image sensor 23 corresponds to the position F12.

On the other hand, referring to FIG. 9A, the third measurement pattern 21 is arranged to be inclined by an angle θ2 with respect to the X-Y plane. Here, it is assumed that the angle θ2 is larger than the angle θ1 (θ2>θ1). Further, a position F21 indicates the best focus position at a given timing, and the image of the third measurement pattern 21 formed on the substrate by the projection optical system 4 in this state is shown as an image 48. When the best focus position changes from the position F21 to a position F22 due to various kinds of factors, the image of the third measurement pattern 21 changes from the image 48 to an image 49. Note that the focus change amount from the position F21 to the position F22 is equal to the focus change amount from the position F11 to the position F12.

Figure 9B:
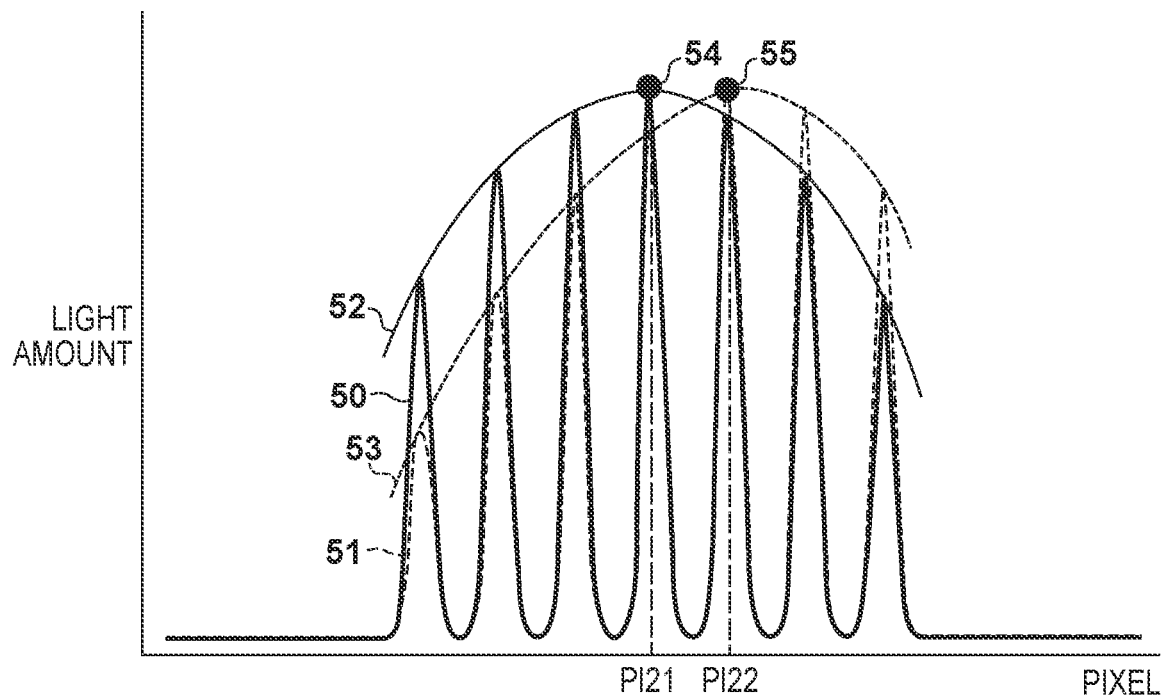

FIG. 9B is a graph showing the image (light amount distribution) detected by the image sensor 23 via the imaging system 22 in the state shown in FIG. 9A, in which the abscissa represents the pixel of the image sensor 23 and the ordinate represents the light amount obtained at each pixel. Referring to FIG. 9B, the image 48 corresponds to a light amount distribution 50, and an envelope 52 is obtained from the light amount distribution 50. Further, a local maximum value 54 and a pixel position PI21 of the image sensor 23 corresponding to the local maximum value 54 are obtained from the envelope 52. In this manner, when the best focus position is the position F21, the pixel position PI21 of the image sensor 23 corresponds to the position F21.

Similarly, the image 49 corresponds to a light amount distribution 51, and an envelope 53 is obtained from the light amount distribution 51. Further, a local maximum value 55 and a pixel position PI22 of the image sensor 23 corresponding to the local maximum value 55 are obtained from the envelope 53. In this manner, when the best focus position is the position F22, the pixel position PI22 of the image sensor 23 corresponds to the position F22.

First, the focus sensitivity will be descried. As has been described above, the focus change amount (the change amount of the best focus position) in FIGS. 8A and 8B is set to be equal to that in FIGS. 9A and 9B. However, the result obtained by the image sensor 23, that is, the change amount from the pixel position PI11 to the pixel position PI12 is different from the change amount from the pixel position PI21 to the pixel position PI22. In this manner, even if the focus change amounts are equal, the change amount of the pixel position on the image sensor is smaller for the larger angle θ. This can be understood from following equation (2) obtained by transforming equation (1).

$$\frac{Mag}{Pixel\ Size} \times \frac{1}{\tan\theta} = \frac{P}{BF} \quad (2)$$

Referring to equation (2), since the magnification Mag and the size of pixel Pixel Size are constants, when the angle θ increases, the value on the left side of equation (2) decreases. Accordingly, if the focus change amounts are equal, when the angle θ is large, the change amount of a pixel position P of the image sensor 23 becomes small. In this manner, the ratio of the change amount of the pixel position P of the image sensor 23 to the focus change amount is inversely proportional to the angle θ. This embodiment uses the change amount of the pixel position P of the image sensor 23 as the focus change amount, so that the size of pixel Pixel Size serves as the measurement resolution of the focus change amount. Therefore, the smaller the angle θ, that is, the larger the change amount of the pixel position P of the image sensor 23, the more accurately the focus change amount can be measured, and it can be said that the focus sensitivity is higher.

Next, the focus position measurement accuracy will be described. As shown in FIGS. 8A to 9B, the sharpness of the envelope changes in accordance with the angle θ of the third measurement pattern 21. This is because the larger the angle θ is, the more the edge portion of the image of the third measurement pattern 21 is away from the imaging plane, so that the light amount detected by the image sensor 23 decreases. Therefore, the larger the angle θ, the sharper the envelope.

The sharpness of the envelope affects the accuracy of determining the local maximum value of the envelope. In general, the local maximum value of the envelope is obtained by approximation from peaks of the light amount distribution obtained by detecting the image of the third measurement pattern 21 to an interpolation curve or a polynomial. However, the light amount distribution obtained from the detection result of the image sensor 23 is, in practice, affected by readout noise or dark noise generated in the image sensor 23. Therefore, when the sharpness of the envelope is low, the accuracy of determining the local maximum value of the envelope tends to decrease. On the other hand, when the sharpness of the envelope is high, the local maximum value of the envelope is less likely to be affected by noise, so that a decrease in accuracy of determining the envelope can be suppressed. In this manner, the larger the angle θ, the higher the focus position measurement accuracy.

As has been described above, the angle θ of the third measurement pattern 21 is related to the trade-off relationship between the focus sensitivity and the focus position measurement accuracy. More specifically, when the angle θ is increased, the focus sensitivity decreases, but the focus position measurement accuracy improves. On the other hand, when the angle θ is decreased, the focus sensitivity increases, but the focus position measurement accuracy decreases. Accordingly, it is required to set the angle θ of the third measurement pattern 21 depending on which of the focus sensitivity and the focus position measurement accuracy is prioritized.

Figure 10:
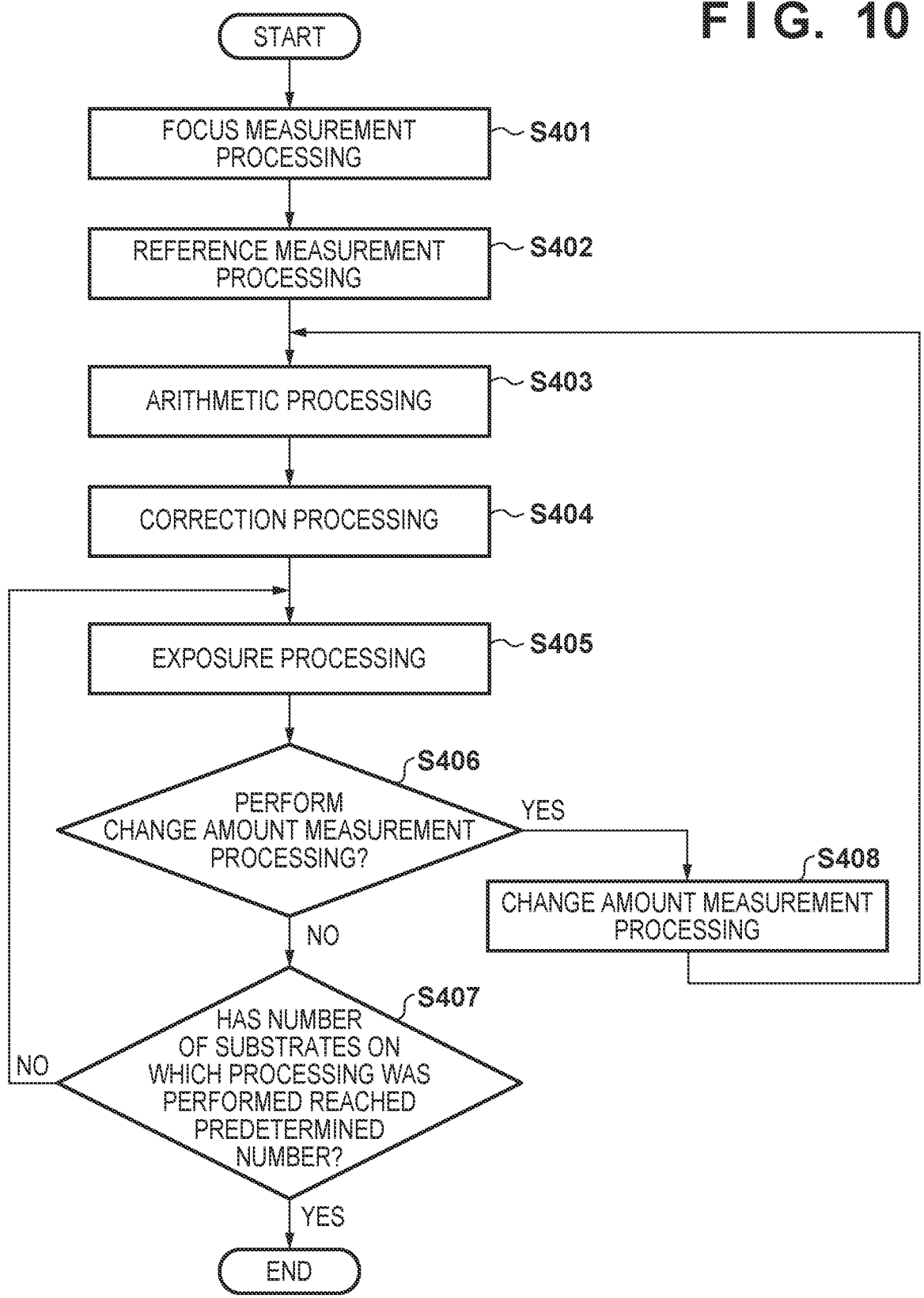
FIG. 10 is a flowchart for explaining an operation of the exposure apparatus shown in FIGS. 1A and 1B.

With reference to FIG. 10, an operation of the exposure apparatus 100 according to this embodiment will be described. Steps S401, S403, S404, S405, and S407 are similar to steps S101, S102, S103, S104, and S105 shown in FIG. 16, respectively, so that the detailed description thereof will be omitted.

In step S402 (the first timing), reference measurement processing is performed. The reference measurement processing is processing of measuring a reference focus position serving as a reference used when obtaining a focus change amount. More specifically, each of the third measurement pattern 21, the imaging system 22, and the image sensor 23 is positioned at its measurement position. Then, as has been described with reference to FIGS. 5A and 5B, the pixel position of the image sensor 23 corresponding to the portion in which the light amount is largest in the light amount distribution obtained from the image of the measurement pattern 21 is obtained.

In step S406 (the second timing after the first timing), it is determined whether to perform change amount measurement processing. The user can arbitrarily set the reference as to whether to perform change amount measurement processing. For example, whether the current substrate is the first substrate in the lot or whether exposure processing has been performed on a predetermined number of substrates can be set as the reference. If no change amount measurement processing is performed, the process advances to step S407. On the other hand, if change amount measurement processing is performed, the process advances to step S408.

Figure 11:
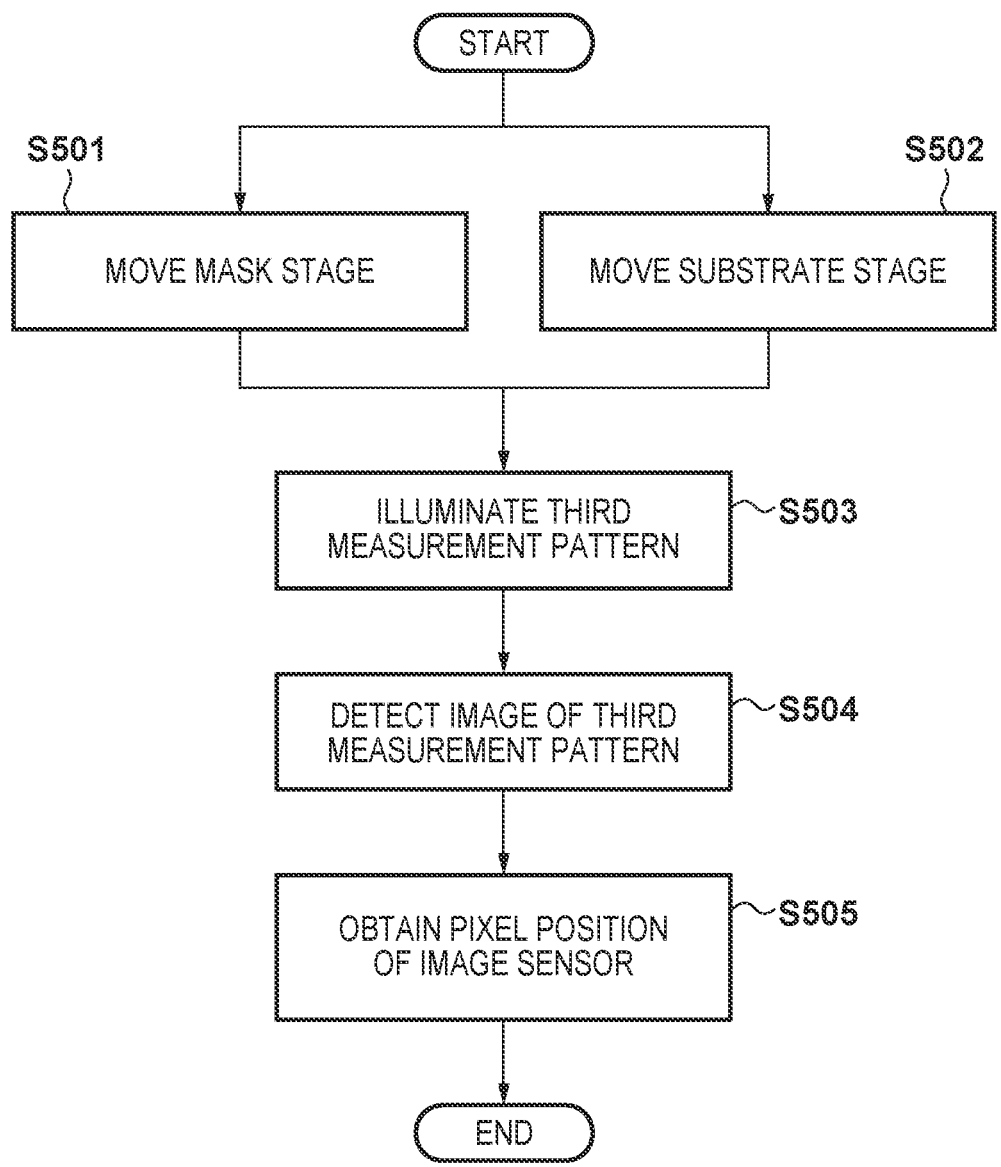
FIG. 11 is a flowchart illustrating the details of the change amount measurement processing.

In step S408, change amount measurement processing is performed. Change amount measurement processing is as described with reference to FIGS. 6A and 6B, but the procedure thereof will be described with reference FIG. 11. In step S501, the mask stage 3 is moved to a change amount measurement position such that the third measurement pattern 21 is located below the illumination optical system 1. In step S502, the substrate stage 6 is moved to a change amount measurement position such that the imaging system 22 and the image sensor 23 are located below the projection optical system 4. Either of steps S501 and S502 may be performed first, or they may be performed in parallel. In step S503, the third measurement pattern 21 is illuminated with light from the illumination optical system 1. Thus, an image of the third measurement pattern 21 is formed on the image sensor via the projection optical system 4 and the imaging system 22. In step S504, the image sensor 23 detects the image of the third measurement pattern 21. In step S505, a light amount distribution is obtained from the image of the third measurement pattern 21 detected in step S504, and the pixel position of the image sensor 23 corresponding to a portion, in which the light amount is largest in the light amount distribution, is obtained. With this operation, as has been described above, from the pixel position of the image sensor 23 obtained in step S505 and the pixel position of the image sensor 23 obtained in step S402, a focus change amount, that is, the change amount of the best focus position can be obtained. In other words, from the difference between the light amount distribution obtained in step S505 and the light amount distribution obtained in step S402, a movement amount of the substrate stage 6 in the optical axis direction required to position the substrate 5 at the best focus position can be obtained.

In this embodiment, as compared with the related art (FIG. 19), the operation of moving the substrate stage 6 in the Z direction (step S204) is unnecessary. Thus, in this embodiment, the focus change amount can be obtained without moving the substrate stage 6 in the Z direction in focus calibration. Accordingly, in this embodiment, when exposure processing operations are continuously performed on a plurality of substrates, it becomes possible to perform focus calibration between one exposure processing and the next exposure processing. Therefore, in each exposure processing, the substrate 5 can be maintained at the best focus position, so that a decrease in exposure accuracy can be suppressed.

Figure 12:
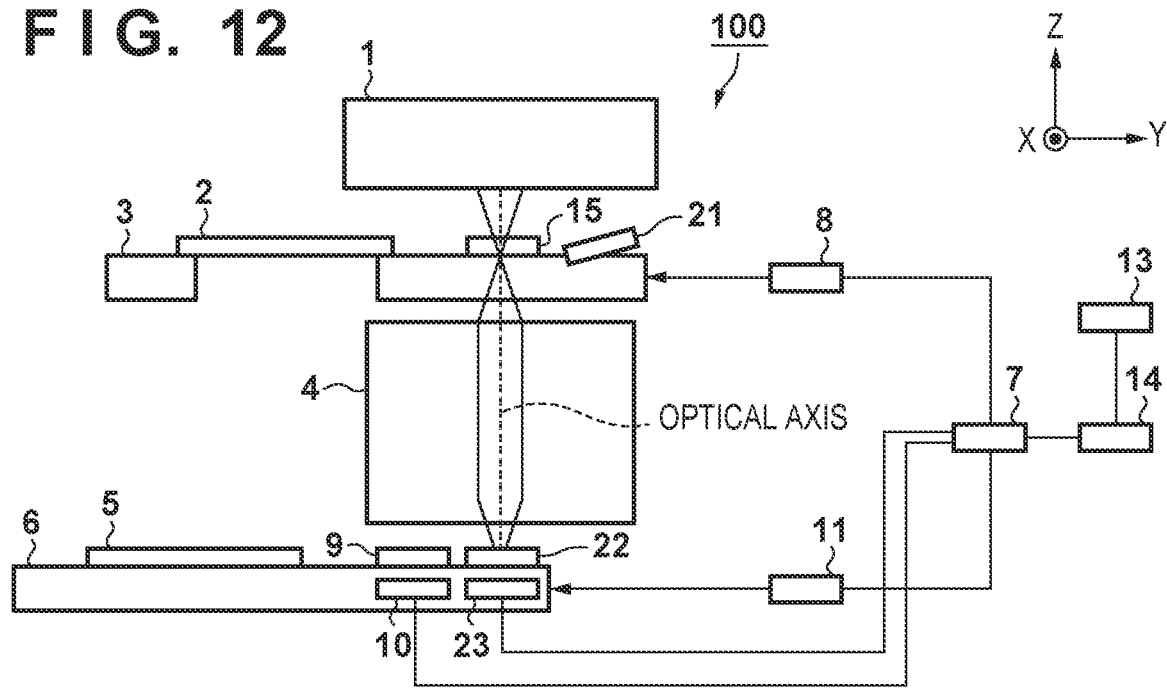
FIG. 12 is a view for explaining the focus measurement processing.
Figure 13A:
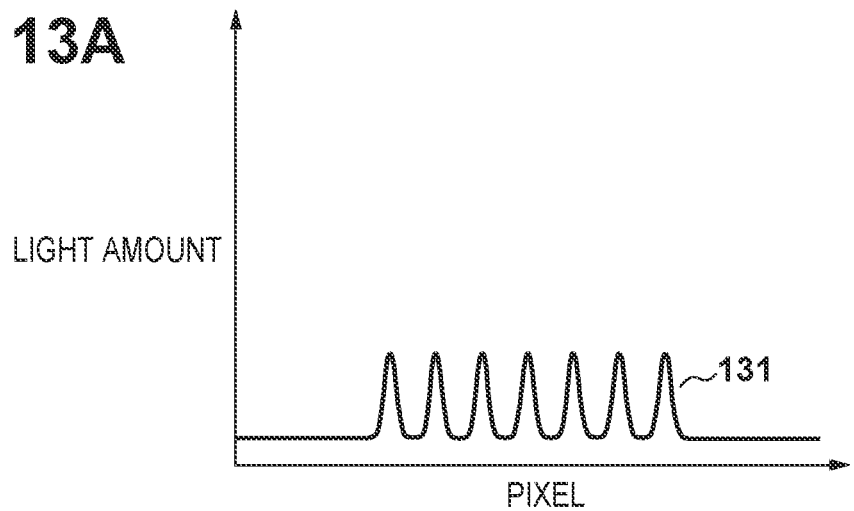
FIGS. 13A and 13B are graphs each showing an example of a detection result of an image sensor.
Figure 13B:
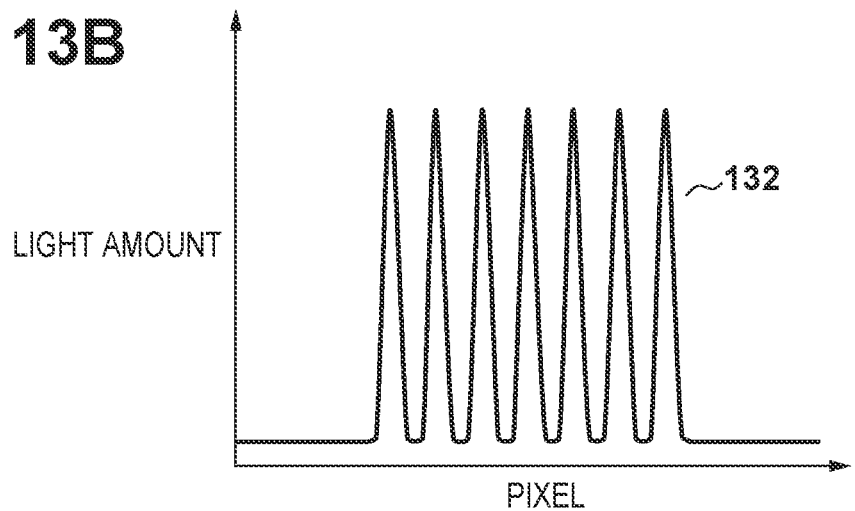

In this embodiment, a case in which the focus measurement processing (step S401) is performed using the first measurement pattern 15, the second measurement pattern 9, and the detector 10 has been described. However, as shown in FIG. 12, the focus measurement processing may be performed using the first measurement pattern 15, the imaging system 22, and the image sensor 23. More specifically, the first measurement pattern 15 is illuminated with light from the illumination optical system 1, and the image sensor 23 detects the light from the first measurement pattern 15 via the projection optical system 4 and the imaging system 22. FIG. 13A is a graph showing an example of the detection result of the image sensor 23. When the pixel of the image sensor 23 is represented by the abscissa and the light amount obtained at each pixel is represented by the ordinate, a light amount distribution 131 is obtained. By slightly moving the substrate stage 6 in the Z direction from the state shown in FIG. 12 (FIG. 13A), a light amount distribution 132 as shown in FIG. 13B is obtained. Thus, by obtaining the Z-direction position of the substrate stage 6 at which the light amount (light amount distribution) detected by the image sensor 23 is largest, this position can be set as the best focus position.

Figure 14:
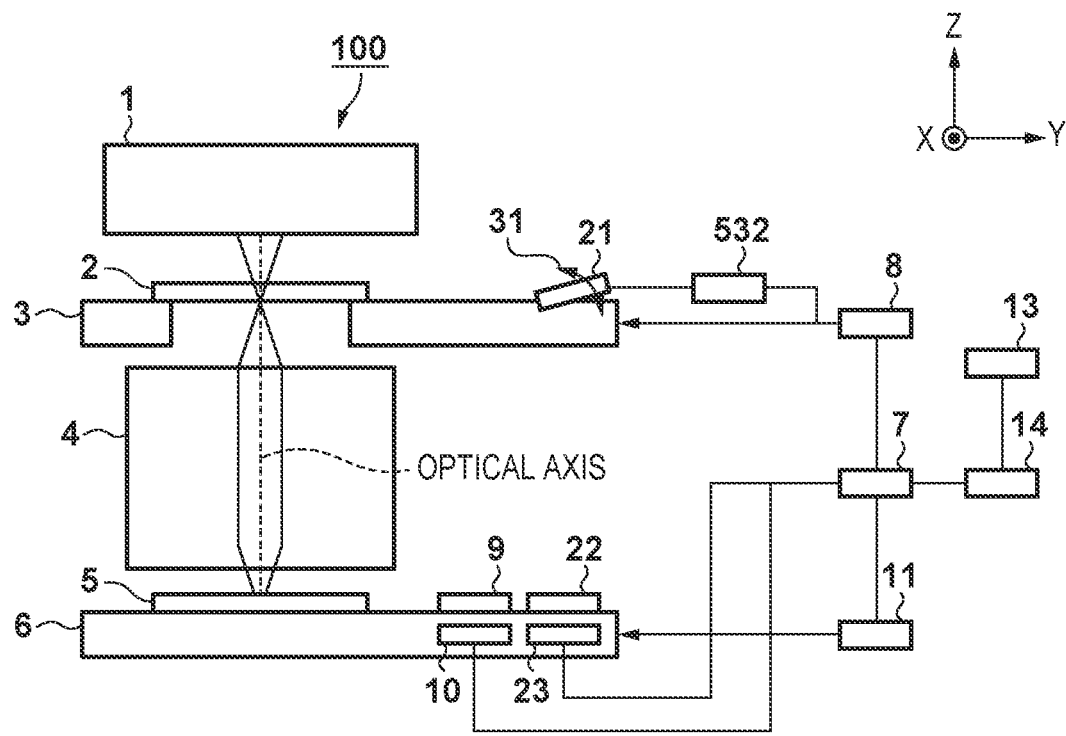
FIG. 14 is a schematic view showing another arrangement of the exposure apparatus as one aspect of the present invention.

In addition, as shown in FIG. 14, the exposure apparatus 100 may further include a rotation unit 532 that rotates the third measurement pattern 21 around an axis (around the X-axis) perpendicular to the optical axis of the projection optical system 4. In this case, the exposure apparatus 100 may not include the first measurement pattern 15. More specifically, when focus measurement processing is performed, the rotation unit 532 rotates the third measurement pattern 21 such that the third measurement pattern 21 becomes parallel to the X-Y plane (such that the normal of the flat plate 21C becomes parallel to the optical axis of the projection optical system 4). In this state, the third measurement pattern 21 is illuminated with light from the illumination optical system 1, and the detector 10 detects the light from the third measurement pattern 21 via the projection optical system 4 and the second measurement pattern 9. At this time, by obtaining a position at which the light amount of the light detected by the detector 10 is largest while slightly moving the substrate stage 6 in the Z direction, this position can be set as the best focus position.

In addition, when change amount measurement processing is performed, the rotation unit 532 rotates the third measurement pattern 21 such that the plurality of pattern elements 21A of the third measurement pattern 21 have different positions in the optical axis direction of the projection optical system 4. In this state, the third measurement pattern 21 is illuminated with light from the illumination optical system 1, and the image sensor 23 detects the light from the third measurement pattern 21 via the projection optical system 4 and the imaging system 22. Then, the pixel position of the image sensor 23 corresponding to a portion, in which the light amount is largest in the light amount distribution obtained from the image of the measurement pattern 21, is obtained.

Here, instead of rotating the third measurement pattern 21 around the axis perpendicular to the optical axis of the projection optical system 4, it is conceivable to rotate the image sensor 23 around the axis perpendicular to the optical axis of the projection optical system 4. However, in this case, an inclination angle θ of the image sensor 23 should be set while considering the magnification of the imaging system 22. In this embodiment, the change of the pixel position of the image sensor 23 is considered to be the focus change. In this case, as is apparent from equation (1), the resolution of the change of the pixel position of the image sensor 23 is determined by the size of pixel (Pixel Size) of the image sensor 23 and the magnification (Mag) of the imaging system 22. In general, in order to increase the resolution of the change of the pixel position of the image sensor 23, the magnification of the imaging system 22 is set to a positive value.

On the other hand, a numerical aperture NA of the projection optical system 4 is determined by the resolution required for the exposure apparatus 100. When the numerical aperture NA at this time is NA1, a numerical aperture NA2 in the image sensor 23 can be expressed, using the magnification Mag of the imaging system 22, as NA1/Mag. As has been descried above, the magnification Mag of the imaging system 22 is a positive value, so that the numerical aperture NA2 is smaller than the numerical aperture NA1.

Here, a depth of focus DOF of the projection optical system 4 is expressed by following equation (3).

$$DOF = k \times \frac{\lambda}{NA^2} \quad (3)$$

where k is a proportional constant, and λ is the wavelength of light entering the projection optical system 4. As expressed by equation (3), when the numerical aperture NA decreases, the depth of focus DOF increases in inverse proportion to the square of the numerical aperture NA. As has been described above, the numerical aperture NA2 in the image sensor 23 becomes smaller than the numerical aperture NA1, but the depth of focus DOF increases. As the depth of focus DOF increases, the image of the third measurement pattern 21 becomes less likely to blur. Therefore, the light amount at each end of the image of the third measurement pattern 21 is less likely to be smaller than the light amount in the center, so that the sharpness of the envelope decreases.

In order to increase the sharpness of the envelope, it is required to incline the image sensor 23. However, since the numerical aperture NA2 is NA1/Mag, it is required to incline the image sensor 23 at an angle larger than the inclination angle of the third measurement pattern 21 by the square of the magnification of the imaging system 22. If the magnification of the imaging system 22 is about several times, it is possible to incline the image sensor 23. However, if the magnification of the imaging system 22 is larger than a certain level, the inclination angle of the image sensor 23 increases, and it becomes impossible to form an image of the third measurement pattern 21 on the image sensor. For example, in this embodiment, assume that the angle θ of the third measurement pattern 21 is 5° and the magnification of the imaging system 22 is five times. In this case, in order to obtain an envelope equivalent to that shown in this embodiment by inclining the image sensor 23, the inclination angle of the image sensor 23 is 75°. Thus, the inclination angle of the image sensor 23 becomes substantially parallel to the light beam of the projection optical system 4, so that it becomes difficult to form an image of the third measurement pattern 21 on the image sensor.

A method of manufacturing an article according to the embodiment of the present invention is, for example, suitable to manufacture an article such as a semiconductor device, a liquid crystal display device, a flat panel display, or a MEMS. The manufacturing method includes a step of exposing a substrate applied with a photosensitive material by using the exposure apparatus 100 described above, and a step of developing the exposed photosensitive material. In addition, an etching step, an ion implantation step, or the like is performed on the substrate using the pattern of the developed photosensitive material as a mask to form a circuit pattern on the substrate. By repeating the steps of exposing, developing, etching, and the like, a circuit pattern formed by a plurality of layers is formed on the substrate. In a postprocessing, dicing (processing) is performed on the substrate with the circuit pattern formed therein, and chip mounting, bonding, and inspection steps are performed. The manufacturing method can also include other known steps (oxidation, deposition, vapor deposition, doping, planarization, resist removal, and the like). The article manufacturing method according to this embodiment is superior to a conventional method in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2019-096252 filed on May 22, 2019, which is hereby incorporated by reference herein in its entirety.

What is claimed is:

1. An exposure apparatus that performs an exposure process to transfer a pattern of a mask to a substrate, comprising:
   a projection optical system configured to project the pattern of the mask onto the substrate;
   a measurement pattern arranged on an object plane of the projection optical system and including a plurality of pattern elements having different positions in an optical axis direction of the projection optical system;
   a first detection unit configured to detect light from the measurement pattern via the projection optical system; and
   a control unit configured to control a relative position between the mask and the substrate in the optical axis direction when the exposure process is performed,
   wherein the control unit controls the relative position based on a first light amount distribution, which represents a light amount of light having passed through each of the plurality of pattern elements, obtained from a detection result of the first detection unit at a first timing and a second light amount distribution, which represents a light amount of light having passed through each of the plurality of pattern elements, obtained from a detection result of the first detection unit at a second timing after the first timing.

2. The apparatus according to claim 1, wherein
the first light amount distribution is obtained from the detection result of the first detection unit arranged at a reference focus position of the projection optical system at the first timing, and
the second light amount distribution is obtained from the detection result of the first detection unit arranged at the reference focus position at the second timing.

3. The apparatus according to claim 2, wherein the reference focus position includes a best focus position of the projection optical system at the first timing.

4. The apparatus according to claim 2, further comprising:
an object plane-side pattern arranged on the object plane of the projection optical system;
an image plane-side pattern arranged on an image plane of the projection optical system; and
a second detection unit configured to detect light from the object plane-side pattern via the projection optical system and the image plane-side pattern,
wherein the control unit determines the reference focus position based on a light amount distribution of light detected by the second detection unit while moving the image plane-side pattern in the optical axis direction.

5. The apparatus according to claim 2, further comprising an object plane-side pattern arranged on the object plane of the projection optical system,
wherein the first detection unit detects light from the object plane-side pattern via the projection optical system, and
the control unit determines the reference focus position based on a change of a light amount of light detected by the first detection unit while moving the first detection unit in the optical axis direction.

6. The apparatus according to claim 2, further comprising a rotation unit configured to rotate the measurement pattern around an axis perpendicular to an optical axis of the projection optical system,
wherein the measurement pattern is formed by a flat plate in which the plurality of pattern elements are formed, and
the rotation unit rotates the measurement pattern such that the plurality of pattern elements have different positions in the optical axis direction at the second timing.

7. The apparatus according to claim 6, further comprising:
an image plane-side pattern arranged on an image plane of the projection optical system; and
a second detection unit configured to detect light from the measurement pattern via the projection optical system and the image plane-side pattern,
wherein the control unit determines, in a state in which the rotation unit has rotated the measurement pattern such that a normal of the flat plate becomes parallel to the optical axis of the projection optical system, the reference focus position based on a change of a light amount of light detected by the second detection unit while moving the image plane-side pattern in the optical axis direction.

8. The apparatus according to claim 1, wherein the control unit controls the relative position by obtaining, from a difference between the first light amount distribution and the second light amount distribution, a movement amount of a stage in the optical axis direction, the stage holding the substrate and the movement amount required to position the substrate at a best focus position of the projection optical system at the second timing, and moving the stage by the movement amount.

9. The apparatus according to claim 1, wherein the measurement pattern is formed by a flat plate in which the plurality of pattern elements are formed, and is arranged such that a normal of the flat plate is inclined with respect to an optical axis of the projection optical system so that the plurality of pattern elements have different positions in the optical axis direction.

10. The apparatus according to claim 1, wherein the first detection unit includes an image sensor configured to detect an image of the measurement pattern.

11. The apparatus according to claim 10, further comprising an imaging system arranged between the projection optical system and the image sensor and configured to form the image of the measurement pattern on the image sensor.

12. A method of manufacturing an article, comprising:
exposing a substrate using an exposure apparatus defined in claim 1;
developing the exposed substrate; and
manufacturing the article from the developed substrate.

13. An exposure apparatus that performs an exposure process to transfer a pattern of a mask to a substrate, comprising:
a projection optical system configured to project the pattern of the mask onto the substrate;
a measurement pattern arranged on an object plane of the projection optical system and including a plurality of pattern elements;
a first detection unit configured to detect light from the measurement pattern via the projection optical system; and
a control unit configured to control a relative position between the mask and the substrate in the optical axis direction based on a first light amount distribution and a second light amount distribution,
wherein the first light amount distribution represents a light amount of light having passed through each of the plurality of pattern elements, obtained from a detection result of the first detection unit at a first timing, the first light amount distribution includes a plurality of peaks having different heights, corresponding to each of the plurality of pattern elements,
wherein the second light amount distribution represents a light amount of light having passed through each of the plurality of pattern elements, obtained from a detection result of the first detection unit at a second timing after the first timing, the second light amount distribution includes a plurality of peaks having different heights, corresponding to each of the plurality of pattern elements, and
wherein the control unit controls the relative position based on an envelope obtained from the plurality of peaks in the first light amount distribution and an envelope obtained from the plurality of peaks in the second light amount distribution.

14. The apparatus according to claim 13, wherein the control unit control the relative position based on a position of the highest peak included in the first light amount distribution and a position of the highest peak included in the second light amount distribution.

15. The apparatus according to claim 13, wherein
the first light amount distribution is obtained from the detection result of the first detection unit arranged at a reference focus position of the projection optical system at the first timing, and
the second light amount distribution is obtained from the detection result of the first detection unit arranged at the reference focus position at the second timing.

16. The apparatus according to claim 15, wherein the reference focus position includes a best focus position of the projection optical system at the first timing.

17. The apparatus according to claim 13, wherein the first detection unit includes an image sensor configured to detect an image of the measurement pattern.

18. The apparatus according to claim 17, wherein the first light amount distribution and the second light amount distribution are obtained in a state where the sensor is tilted.

19. A method of manufacturing an article, comprising:
exposing a substrate using an exposure apparatus defined in claim 13;
developing the exposed substrate; and
manufacturing the article from the developed substrate.

* * * * *